(12) United States Patent
Takayama et al.

(10) Patent No.: US 7,741,642 B2
(45) Date of Patent: Jun. 22, 2010

(54) SEMICONDUCTOR DEVICE AND MANUFACTURING METHOD THEREOF

(75) Inventors: Toru Takayama, Atsugi (JP); Junya Maruyama, Ebina (JP); Yumiko Ohno, Atsugi (JP); Masakazu Murakami, Atsugi (JP); Toshiji Hamatani, Atsugi (JP); Hideaki Kuwabara, Isehara (JP); Shunpei Yamazaki, Setagaya (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 348 days.

(21) Appl. No.: 11/702,058

(22) Filed: Feb. 5, 2007

(65) Prior Publication Data

US 2007/0138954 A1    Jun. 21, 2007

Related U.S. Application Data

(62) Division of application No. 10/697,941, filed on Oct. 31, 2003, now Pat. No. 7,180,093.

(30) Foreign Application Priority Data

Nov. 1, 2002    (JP) .............................. 2002-320270

(51) Int. Cl.
  *H01L 29/04*    (2006.01)
  *H01L 29/15*    (2006.01)
(52) U.S. Cl. .................... 257/59; 257/72; 257/E29.202
(58) Field of Classification Search .................. 257/59, 257/72, E29.202
  See application file for complete search history.

(56) References Cited

U.S. PATENT DOCUMENTS

| 5,347,154 | A | 9/1994 | Takahashi et al. |
| 5,486,708 | A | 1/1996 | Takahashi et al. |
| 5,572,045 | A | 11/1996 | Takahashi et al. |
| 5,618,739 | A | 4/1997 | Takahashi et al. |
| 5,643,804 | A | 7/1997 | Arai et al. |

(Continued)

FOREIGN PATENT DOCUMENTS

EP    0 486 318    5/1992

(Continued)

OTHER PUBLICATIONS

International Preliminary Report, Application No. PCT/JP03/13553, dated Aug. 3, 2004.

(Continued)

*Primary Examiner*—Kenneth A Parker
*Assistant Examiner*—Joseph Nguyen
(74) *Attorney, Agent, or Firm*—Eric J. Robinson; Robinson Intellectual Property Law Office, P.C.

(57) ABSTRACT

The object is to provide a lightened semiconductor device and a manufacturing method thereof by pasting a layer to be peeled to various base materials.

In the present invention, a layer to be peeled is formed on a substrate, then a seal substrate provided with an etching stopper film is pasted with a binding material on the layer to be peeled, followed by removing only the seal substrate by etching or polishing. The remaining etching stopper film is functioned as a blocking film. In addition, a magnet sheet may be pasted as a pasting member.

15 Claims, 16 Drawing Sheets

U.S. PATENT DOCUMENTS

| | | |
|---|---|---|
| 5,728,591 A | 3/1998 | Takahashi et al. |
| 6,127,199 A | 10/2000 | Inoue et al. |
| 6,312,795 B1 | 11/2001 | Yamamoto |
| 6,313,481 B1 | 11/2001 | Ohtani et al. |
| 6,331,722 B1 | 12/2001 | Yamazaki et al. |
| 6,372,608 B1 | 4/2002 | Shimoda et al. |
| 6,436,520 B1 | 8/2002 | Yamamoto |
| 6,566,235 B2 | 5/2003 | Nishida et al. |
| 6,596,571 B2 | 7/2003 | Arao et al. |
| 6,645,830 B2 | 11/2003 | Shimoda et al. |
| 6,646,711 B2 | 11/2003 | Sugano |
| 6,814,832 B2 | 11/2004 | Utsunomiya |
| 6,900,861 B2 | 5/2005 | Yasui |
| 6,921,917 B2 | 7/2005 | Choi et al. |
| 6,946,361 B2 | 9/2005 | Takayama et al. |
| 7,005,671 B2 | 2/2006 | Yamazaki et al. |
| 7,060,153 B2 | 6/2006 | Yamazaki et al. |
| 2002/0171910 A1 * | 11/2002 | Pullen et al. ............... 359/296 |
| 2003/0032210 A1 | 2/2003 | Takayama et al. |
| 2003/0082889 A1 | 5/2003 | Maruyama et al. |
| 2003/0127974 A1 * | 7/2003 | Miyazawa ................. 313/504 |
| 2006/0030122 A1 | 2/2006 | Shimoda et al. |

FOREIGN PATENT DOCUMENTS

| | | |
|---|---|---|
| EP | 0 858 110 | 8/1998 |
| EP | 1 081 721 | 3/2001 |
| JP | 10-125929 | 5/1998 |
| JP | 10-125930 | 5/1998 |
| JP | 10-125931 | 5/1998 |
| JP | 10-256576 | 9/1998 |
| JP | 11-142878 | 5/1999 |
| JP | 11-243209 | 9/1999 |
| JP | 2001-051296 | 2/2001 |
| JP | 2001-217443 | 8/2001 |
| JP | 2002-087844 | 3/2002 |
| JP | 2002-184959 | 6/2002 |
| JP | 2002-278473 | 9/2002 |
| TW | 362266 | 6/1999 |

OTHER PUBLICATIONS

International Preliminary Examination Report, Application No. PCT/JP03/13553, dated Mar. 30, 2004.

International Search Report, Application No. PCT/JP03/13553, Feb. 10, 2004.

* cited by examiner (A)

(B) A state of the second substrate 15 after the adhesion (C) Dissolution and removal processes of the second substrate 15

(A) After forming a layer to be peeled (B) A state of the second substrate 25 after the adhesion (C) Dissolution and removal processes of the second substrate 25

(A) After forming a layer including an element (B) A state of the second substrate 35 after the adhesion (C) A state of the first substrate 30 after peeling (D) Dissolution and removal processes of the second substrate 35

(A) After forming a layer to be peeled (B) A state of the second substrate 15 after the adhesion (C) Dissolution and removal processes of the second substrate 15

(D) A state of a third substrate after the adhesion

Dissolution and removal processes of the third substrate 53

(A) After forming a layer to be peeled (B) Coating of water soluble resin (C) Bonding with a double-stick tape (D) Peeling-off (E) Bonding of a plastic substrate (F) Peeling-off (G) Peeling-off (H) Removal of water soluble resin (I) Formation of an organic compound layer and a cathode (J) Bonding a glass substrate (K) Etching of a glass substrate (L)

(A) A formation of a layer to be peeled (TFT)

(B) A formation of a layer to be peeled (an organic layer and a cathode)

(C) Sealing (D) Etching of a glass substrate (E)

(A) A formation of a layer to be peeled (TFT)

(B) A Formation of a layer to be peeled (an organic layer and a cathode)

(C) Sealing (D) Separating of a glass substrate (E) Bonding of a plastic substrate (F) Etching of a quartz substrate (G)

(A) A configuration of a layer to be peeled
(CPU including CMOS circuit)

(B) Sealing (C) Etching of a glass substrate (D) Bonding (E) Peeling-off

SEMICONDUCTOR DEVICE AND MANUFACTURING METHOD THEREOF

TECHNICAL FIELD

The present invention relates to a semiconductor device having a circuit comprising a thin film transistor (hereinafter referred to as TFT) and a method for manufacturing thereof. For example, it relates to an electro-optical device typified by a liquid crystal display panel and an electronics device in which a light-emitting display device having an organic light-emitting element is mounted as a component. In addition, the present invention also relates to a card (an IC card) including an integrated circuit.

In the present specification, the term, 'semiconductor device', generally indicates devices that are capable of functioning by utilizing semiconductor characteristics, and an electro-optical device, a semiconductor circuit, and an electronics device are all included in the semiconductor device.

BACKGROUND ART

In recent years, attention has been paid to a technique of comprising a thin film transistor (TFT) by using a semiconductor thin film (thickness around several to several hundreds nm) formed on a substrate having an insulating surface. The thin film transistor is widely applied to an electronic devices such as IC or an electro-optical device, and has been rapidly developed especially as a switching element of an image display device.

Various applications using such an image display device are expected, and in particular utilization for a portable device draws attention. At present, although a lot of glass substrates or quartz substrates are used, these are easily broken and heavy, which are defects. In addition, a glass substrate or a quartz substrate is difficult to enlarge and unsuitable in a mass production. Therefore, forming TFT element on a substrate with flexibility, representatively, on a flexible plastic film is attempted.

However, it is inevitable to lower the highest temperature of a process because the heat resistance of a plastic film is low, and as a result, it is impossible to form TFT with electric properties as favorable as the time forming on a glass substrate, which is the present state. Therefore, a high performance liquid crystal display device or light-emitting element using a plastic film is not realized.

In addition, a peeling method for peeling a layer to be peeled existing over a substrate through an isolation layer from the substrate, has been already suggested. For example, the patent document 1 and the patent document 2 describe a technique of separating a substrate by providing an isolation layer of amorphous silicon (or polysilicon) and irradiating a laser light through the substrate to release hydrogen contained in the amorphous silicon to form air gap. Moreover, the patent document 3 gives a description of sticking a layer to be peeled (in the publication, called a layer to be transferred) to a plastic film with the use of this technique to complete a liquid crystal display device.

However, in the aforementioned method, it is essential to use a highly transparent substrate, and irradiation of a relatively large laser light is required to pass through the substrate and then to release hydrogen contained in the amorphous silicon, which cause some damage to a layer to be peeled. Further, in the aforementioned method, in a case of forming an element on an isolation layer, hydrogen contained in the isolation layer is diffused and decreased if a heat treatment at a high temperature is carried out in the process of manufacturing the element. As a result, there is a possibility of insufficient peeling even if a laser light is irradiated at the isolation layer. Therefore, there is a problem that a process after forming the isolation layer is limited to keep the amount of hydrogen contained in the isolation layer. Although the aforementioned publication gives a description of forming a light-shielding layer or a reflection layer in order to prevent the layer to be peeled from being damaged, in that case, it becomes difficult to fabricate a transmission type liquid crystal display device. Moreover, in the aforementioned method, it is difficult to peel a layer to be peeled with a large surface.

Patent Document 1: Japanese Patent Application Laid-Open No. H10-125929

Patent Document 2: Japanese Patent Application Laid-Open No. H10-125931

Patent Document 3: Japanese Patent Application Laid-Open No. H10-125930

DISCLOSURE OF INVENTION

The present invention has been accomplished in view of the aforementioned problems, and it is an object to provide a method of peeling without damaging a layer to be peeled, and to allow not only a layer to be peeled with a small surface area but also a layer to be peeled with a large surface are to be peeled entirely.

Further, it is also an object of the present invention to provide a lighter semiconductor device and a manufacturing method thereof by sticking a layer to be peeled to a variety of substrates. Particularly, it is an object to provide a lighter semiconductor device and a manufacturing method thereof by sticking a variety of elements (a thin film diode, a photo-electric transducer comprising a PIN junctions of silicon, and a silicon resistor element) typified by TFT to a flexible film.

In the present invention, a layer to be peeled is formed on a first substrate, then a second substrate (a sealing substrate) provided with an etching stopper film is pasted by a binding material to the layer to be peeled, followed by removing only the second substrate (the sealing substrate) by etching or polishing. Process time can be shortened by etching after thinning the substrate by mechanical polishing. It is desirable that the remaining etching stopper film is functioned as a blocking film. Alternatively, after at least one of the first or second substrate is removed by etching or polishing, the layer to be peeled is pasted to a member by a binding material.

The binding material may include a reaction-curing pattern, a heat-curing pattern, a photo-curing pattern, and an anaerobic pattern. As a composition of these binding materials, for example, any of such as epoxy system, acrylate system, silicon system can be used. Preferably, a composition which can take selection ratio when etching the substrate.

In addition, in the present invention a magnet sheet is pasted as a member to stick. A magnet sheet is sheet-like and flexible, and can be detachably attached to a magnetism surface such as a whiteboard and a steelboard, thereby wide usage such as an office display, or symbol of a newly-licensed driver of automobile is thought, which enables to be attached anywhere if it is a magnetism surface such as a steel plate.

A magnet sheet is formed sheet-like after, for example, barium ferrite, strontium ferrite, or powder of rare earth magnet and the like are mixed with an organic polymer compound such as plastic and binder. In addition, the mixing ratio of ferrite magnet and plastic is preferably 80 to 90 weight percent of powder of ferrite magnet, and 10 to 20 weight percent of others. The magnet sheet is adhered to the layer to be peeled by a binding material, moreover, a metal line formed on the layer to be peeled can be attracted by the magnetic force of the magnet sheet, thereby adhesion of the layer to be peeled and the magnet sheet can be improved. Additionally, thermal conductivity can be added to the magnet sheet to promote heat radiation of an element, then reliability improves.

Besides, the substrate may be peeled by a physical means that provides a lamination layer of a metal film and an oxide film between the first substrate and the layer to be peeled, removes only the second substrate (the sealing substrate) by etching. In other words, an another substrate is removed by a method which is different from a method of removing the other substrate.

Furthermore, an etching stopper (a blocking film) and a binding material may be laminated by repeating a process which pastes a substrate provided with an etching stopper film and removes only the substrate by etching.

The present invention enables to fabricate a light-emitting device or a liquid crystal display device in which an organic light-emitting element is formed on a magnet sheet with bendability, flexibility, or resilience, whereby in addition to the characteristics of thin, light, and splinterless, they can be utilized in a display with a curved surface or a show-window and the like. Therefore, the usage is not limited to a portable device, and the application range is very broad.

The configuration of the presently disclosed invention in the present specification is a semiconductor device comprising:

a support which is a sheet comprising a ferromagnetic material;

a binding material adjacent to the sheet comprising the ferromagnetic material; and an element on an insulating film adjacent to the binding material.

In the aforementioned structure, the element is a thin film transistor, a light-emitting element having a layer containing an organic compound, an element having liquid crystal, a memory element, a thin film diode, a photoelectric transducer comprising PIN junctions of silicon, or a silicon resistance element.

In addition, in the aforementioned structure, the sheet comprising the ferromagnetic material is formed by mixing soft magnetic powder and synthetic resin, then magnetized.

Additionally, a configuration in connection with a manufacturing method to realize the aforementioned configuration is a manufacturing method of a semiconductor device comprising the following steps:

a first step of forming a layer to be peeled including a semiconductor element on a first substrate;

a second step of pasting a second substrate provided with an etching stopper layer to the layer to be peeled with a binding material; and a third step of removing only the second substrate by etching or polishing.

Additionally, a configuration in connection with another manufacturing method of the present invention is a manufacturing method of a semiconductor device comprising the following steps:

a first step of forming a first etching stopper layer on a first substrate;

a second step of forming a layer to be peeled including a semiconductor element on the first etching stopper layer;

a third step of pasting a second substrate provided with a second etching stopper layer to the layer to be peeled with a binding material; and a fourth step of removing at least one of the first substrate or the second substrate by etching or polishing.

In addition, in the aforementioned structure, the etching stopper layer is SrO, $SnO_2$, or fluoropolymer such as Teflon (a registered trademark) or monolayer of W, or these lamination layer.

When separating a substrate from a layer to be peeled, TFT included in the layer to be peeled could be damaged if the layer to be peeled is cracked. When separating the substrate from the layer to be peeled, it is preferable not to damage by the layer to be peeled being bent, and dissolving by etchant is a method that will give least damage to the layer to be peeled.

In addition, a layer including a large scale integrated circuit (LSI) such as CPU can be formed as a layer to be peeled, and another configuration of the present invention is a semiconductor device comprising:

a support which is a binding material;

a protective film on the binding material;

a middle processing component comprising a control section and an operation section, and a memory unit on an insulating film adjacent to the binding material; and the middle processing component includes a thin film transistor of n-channel type and a thin film transistor of p-channel type.

In addition, in the aforementioned structure, it could be a semiconductor device provided with a middle processing component which assumes a sheet comprising a binding material and a ferromagnetic material is a support by pasting the sheet to the binding material comprising the ferromagnetic material.

In addition, a configuration in connection with another manufacturing method of the present invention is a manufacturing method of a semiconductor device comprising the following steps:

a first step of forming a layer to be peeled including a semiconductor element on a first substrate;

a second step of applying a film including organic resin which dissolves to solvent on the layer to be peeled;

a third step of adhering a second substrate on the organic resin film with a first double-stick tape, and sandwiching the layer to be peeled and the film containing the organic resin between the first substrate and the second substrate;

a fourth step of adhering a third substrate to the first substrate with a second double-stick tape;

a fifth step of separating the first substrate on which the third substrate is adhered from the layer to be peeled by a physical means;

a sixth step of adhering a sheet comprising a ferromagnetic material to the layer to be peeled with the first binding material, and sandwiching the layer to be peeled between the second substrate and the sheet comprising the ferromagnetic material;

a seventh step of separating the layer to be peeled and the first double-stick tape from the second substrate;

a eighth step of separating the layer to be peeled from the first double-stick tape; and a ninth step of removing the film containing the organic resin with solvent.

In addition, a configuration of another manufacturing method of the present invention is a manufacturing method of a semiconductor device comprising the following steps:

a first step of forming a layer to be peeled including a semiconductor element on a first substrate;

a second step of applying a film containing organic resin which dissolves to solvent on the layer to be peeled;

a third step of adhering a second substrate on the film containing the organic resin with a first double-stick tape, and sandwiching the layer to be peeled and the film containing the organic resin between the first substrate and the second substrate;

a fourth step of adhering a third substrate to the first substrate with a second double-stick tape;

a fifth step of separating the first substrate adhered by the third substrate from the layer to be peeled by a physical means;

a sixth step of adhering a sheet comprising a ferromagnetic material to the layer to be peeled with a first binding material, and sandwiching the layer to be peeled between the second substrate and the sheet comprising the ferromagnetic material;

a seventh step of separating the layer to be peeled and the first double-stick tape from the second substrate;

an eighth step of separating the layer to be peeled from the first double-stick tape;

a ninth step of removing the film containing the organic resin with solvent; and a tenth step of adhering a seal substrate to the layer to be peeled with a second binding material, and sandwiching the layer to be peeled between the sheet comprising the ferromagnetic material and the seal substrate.

In addition, after forming a light-emitting element, damage by a process of such as heat or plasma should be avoided. However, to form a passivation film having high barrier characteristics, heat, spatter damage, or plasma damage can be given. On the other hand, it is possible to form a passivation film on a light-emitting element without being limited by a process because in the present invention, a passivation film having high barrier characteristics is formed on a substrate, and the passivation film is pasted on an organic light-emitting element, and substrate is then dissolved.

A configuration of another manufacturing method of the present invention is a manufacturing method of a semiconductor device comprising the following steps:

a first step of forming a layer to be peeled including TFT on a first substrate;

a second step of applying a film containing organic resin which dissolves to solvent on the layer to be peeled;

a third step of adhering a second substrate on the film containing the organic resin with a first double-stick tape, and sandwich the layer to be peeled and the film containing the organic resin between the first substrate and the second substrate;

a fourth step of adhering a third substrate to the first substrate with a second double-stick tape;

a fifth step of separating the first substrate on which third substrate is adhered from the layer to be peeled by a physical means;

a sixth step of adhering a fourth substrate to the layer to be peeled with a first binding material, and sandwich the layer to be peeled between the second substrate and the fourth substrate;

a seventh step of separating the layer to be peeled and the first double-stick tape from the second substrate;

an eighth step of separating the layer to be peeled from the first double-stick tape;

a ninth step of removing the film containing the organic resin with solvent;

a tenth step of forming a light-emitting element containing an organic compound on the layer to be peeled; and an eleventh step of pasting a sheet comprising a ferromagnetic material which seals the light-emitting element with a second binding material, and sandwich the layer to be peeled between the fourth substrate and the ferromagnetic material.

In addition, in the configuration related to each aforementioned manufacturing method, the solvent is water or alcohol.

In addition, in the configuration related to each aforementioned manufacturing method, the adhesion of the layer to be peeled and the sheet comprising the ferromagnetism or the fourth substrate is higher than the adhesion of the first double-stick tape and the second substrate in the seventh process.

In addition, in the configuration related to each aforementioned manufacturing method, the first substrate is a glass substrate, the second substrate and the third substrate is a ceramic substrate or a metal substrate, and the fourth substrate is a plastic substrate.

In addition, in the configuration related to each aforementioned manufacturing method, the fourth substrate and the fifth substrate is a plastic film which a protective film is formed on the surface.

In addition, in the configuration related to each aforementioned manufacturing method, the layer to be peeled includes a thin film transistor, a light-emitting element having a layer containing an organic compound, an element having liquid crystal, a memory element, a thin film diode, a photoelectric transducer comprising PIN junctions of silicon, or a silicon resistance element.

In a peeling method of the present invention, thermal treatment can be conducted which is of the temperature that is not higher than heat proof temperature of the first substrate when forming an element. In addition, peeling is possible in the following step without a problem even if a laser light is irradiated when forming an element. Thus, an element with high electric characteristics can be formed on the first substrate, and these elements can be printed to a plastic substrate or a magnet sheet.

Additionally, in the present specifications, all layers to be installed between cathode and anode is named generally an EL layer. Thus, the aforementioned hole injection layer, the hole transport layer, the light emitting layer, the electron transport layer, and the electron injection layer are all included in an EL layer.

In addition, in the present specification, an EL element is an EL material, and a light-emitting element comprising a structure which a layer including an organic material or an inorganic material to implant carrier (hereafter referred to as, an EL layer) is sandwiched by two electrodes (anode and cathode), and means a diode comprising anode, cathode, and an EL layer.

According to the present invention, it can be used in a field such as a display or a shopwindow having characteristics of thin, light and splinterless with a curved surface.

In addition, with the present invention, it can be magnetized everywhere if it is a magnetic material side such as a steel plate.

In addition, with the present invention, it can be transferred to a plastic substrate hardly damaging the layer to be peeled.

BEST MODE FOR CARRYING OUT THE INVENTION

Embodiment modes of the present invention will be hereinafter described as follows.

Embodiment Mode 1

Figure 1:
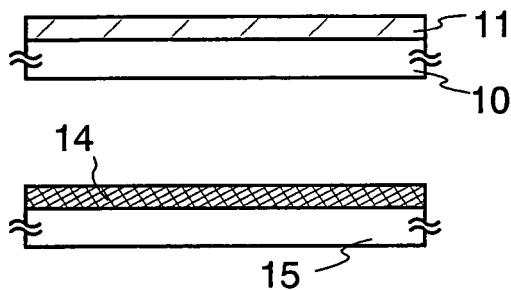
FIG. 1 is a figure which shows a manufacturing process of the present invention. (Embodiment Mode 1)
Figure 1:
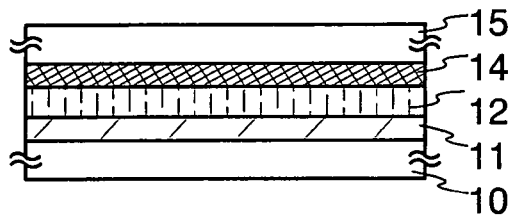
Figure 1:
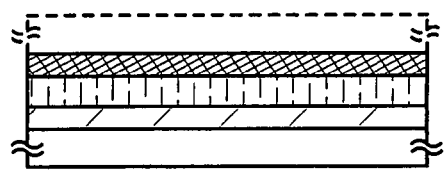

At first, two pieces of substrates are provided as shown in FIG. 1 (A). An example is shown which uses a plastic substrate (a PC substrate) as a first substrate 10, and a glass substrate (may be a quartz substrate) as a second substrate 15.

A layer 11 including an element is formed on the first substrate 10. In addition, the layer 11 including an element may be a layer including various elements typified by TFT (a thin film diode, and a photoelectric transducer comprising a PIN junctions of silicon, a silicon resistance element, and a sensor element (representatively, a pressure-sensitive fingerprint sensor with the use of polysilicon)). Then, an etching stopper film 14 is formed on a second substrate 15. The etching stopper film is formed by a vapor deposition method or a sputtering method. The etching stopper film 14 is preferably a material which can set selection ratio with the second substrate, and a material which can function as a passivation film later. As the etching stopper film 14, an $SnO_2$ film, an SrO film, a Teflon film, or a metal film (typified by platinum, gold, W) can be given. However, when a metal film having a thick film thickness is used, it is a device in which a light is not transmitted to the side of the etching stopper film 14. Moreover, a silicon nitride film or a silicon oxide film having high barrier characteristics can be provided between the second substrate 15 and the etching stopper film 14 to function as a passivation film.

Next, each substrate is adhered each other by a binding material 12. (FIG. 1 (B)) As the binding material 12, various types of curing adhesive, for example, a reaction-curing adhesive, a heat-curing adhesive, a photo-curing adhesive such as a UV-curing adhesive, or the like, or an anaerobic adhesive is utilized.

Next, only the second substrate 15 is removed. (FIG. 1 (C)) Here, only the second substrate which is a glass substrate is dissolved by a mixed solution of hydrofluoric acid (HF) and sulfuric acid ($H_2SO_4$). Etching rate increases only with fluorinated acid and precipitation appears on the surface of the substrate. Sulfuric acid is added to control this precipitation. In addition, it is preferable to cover the substrate end with such as organic resin (OH group is not provided) so that the layer including the element is not etched. Here, the example where the first substrate and the second substrate are different is shown because it is an example about melting the second substrate by soaking into a container where the mixed solution is in. However, when a spin etching device making the substrate spins while dripping the solution is used, a glass substrate the same as the second substrate can be used as the first substrate.

In addition, it is desirable to conduct etching after making the thickness of the second substrate 15 thin with mechanical polishing, since it takes a time to remove the second substrate 15 only by etching.

In this way, a semiconductor device comprising the layer 11 including an element, the binding material 12, and the etching stopper film 14 is completed on the first substrate 10.

In addition, even though it is not illustrated here, a magnet sheet can be pasted by using a binding material to contact with the etching stopper film 14.

Embodiment Mode 2

Here, an example when a first substrate 20 and a second substrate 25 are assumed the same glass materials is shown.

Figure 2:
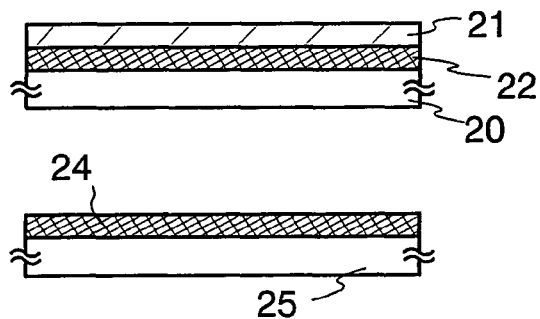
FIG. 2 is a figure which shows a manufacturing process of the present invention. (Embodiment Mode 2)
Figure 2:
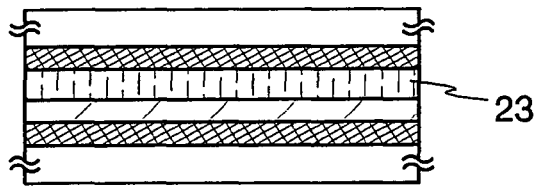
Figure 2:
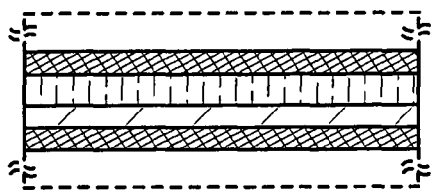

At first, two pieces of substrate are provided as shown in FIG. 2(A). An etching stopper film 22 and a layer 21 including an element are formed on the first substrate 20. In addition, the layer 21 including an element may be a layer including various elements typified by TFT (a thin film diode, and a photoelectric transducer comprising a PIN junctions of silicon, a silicon resistance element, and a sensor element (representatively, a pressure-sensitive fingerprint sensor with the use of polysilicon)).

Then, an etching stopper film 24 is formed on the second substrate 25. A material which can take selection ratio with the substrate is preferable for the etching stopper films 22 and 24, and a material which can function as a passivation film later is preferable. As the etching stopper films 22 and 24, an $SnO_2$ film, an SrO film, a Teflon film, or a metal film (typified by W) can be given. Moreover, a silicon nitride film or an silicon oxide film having high barrier characteristics may be provided between the second substrate 25 and the etching stopper film 24, and between the first substrate 20 and the etching stopper film 22 to function as a passivation film.

Next, each substrate is adhered each other by a binding material 23. (FIG. 2 (B)) As the binding material 23, various types of curing adhesive, for example, a reaction-curing adhesive, a heat-curing adhesive, a photo-curing adhesive such as a UV-curing adhesive, or the like, or an anaerobic adhesive is utilized.

Next, only the first substrate 20 and the second substrate 25 are removed. (FIG. (C)) Here, only the first substrate and the second substrate are dissolved by soaking into a container which a mixed solution of hydrofluoric acid (HF) and sulfuric acid ($H_2SO_4$) is in.

In this way, a semiconductor device comprising the layer 21 including an element, the binding material 22, and the etching stopper film 24 is completed on the etching stopper film 22.

In addition, even though it is not illustrated here, a magnet sheet can be pasted by using a binding material to contact either with the etching stopper film 22 or with the etching stopper film 24.

Embodiment Mode 3

Figure 3:
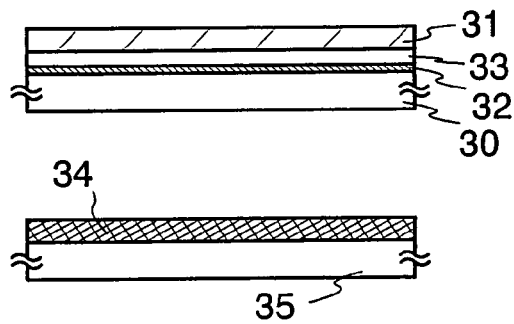
FIG. 3 is a figure which shows a manufacturing process of the present invention. (Embodiment Mode 3)
Figure 3:
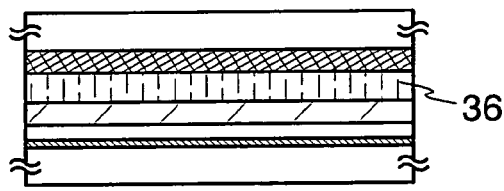
Figure 3:
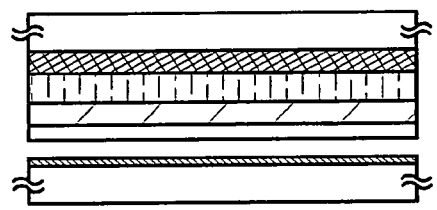
Figure 3:
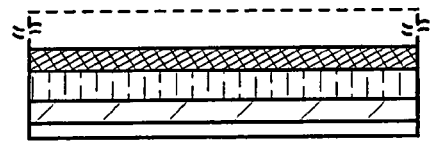

Here, an example where a method of peeling a substrate is different from a method of peeling the other substrate is shown in FIG. 3.

At first, a metal layer 32, an oxide layer 33, and a layer 31 including an element are laminated on a first substrate 30.

As the metal layer 32, an element selected from the group consisting of W, Ti, Ta, Mo, Nd, Ni, Co, Zr, Zn, or a monolayer comprising an alloy material or a chemical compound material that contains the element as its main constituent, or a lamination layer of these, or nitride of these, for example, a monolayer comprising titanium nitride, tungsten nitride, tantalum nitride and molybdenum nitride, or a lamination layer of these may be used. The film thickness of the nitride layer or the metal layer 32 is 10 nm to 200 nm, preferably 50 nm to 75 nm.

Further, a film thickness in the vicinity of a peripheral portion of the substrate is likely to be ununiform because the substrate is fixed by sputtering. Therefore, it is preferable that only the peripheral portion is removed by conducting dry etching. At this time, an insulating film comprised of a silicon nitride oxide film may be formed to have thickness of approximately 100 nm between the substrate 30 and the nitride layer or the metal layer 32 in order to prevent the substrate from being subjected to etching.

In addition, as the oxide layer 33, a layer comprising silicon oxide, silicon nitride oxide, and a metal oxide material may be formed by sputtering. Desirably, the film thickness of the oxide layer 33 is equal or more than twice the thickness of the nitride layer or the metal layer 32. Here, a silicon oxide film is formed to have a thickness of 150 nm to 200 nm by sputtering with the use of a silicon oxide target.

In addition, when forming the layer 31 including an element, after forming a material film which at least contains hydrogen (a semiconductor film or a metal film), a heating treatment to diffuse hydrogen contained in the material film containing hydrogen is carried out. The heating treatment may be carried out at 410° C. or more, and it can be performed separately from one in the formation process of the layer 31 including an element, or omitted by combination thereof For example, when a polysilicon film is formed by heating an amorphous silicon containing hydrogen as a material film containing hydrogen, it is possible to diffuse hydrogen at the same time of forming a polysilicon film if a heating treatment at 500° C. or more is carried out. In addition, the layer 31 including an element may be a layer including various elements typified by TFT (a thin film diode, a photoelectric transducer comprising a PIN junctions of silicon, a silicon resistance element, and a sensor element (representatively, a pressure-sensitive fingerprint sensor with the use of polysilicon)).

In addition, separately from the first substrate 30, a second substrate 35 is provided. An etching stopper film 34 is formed on the second substrate 35. The etching stopper film 34 is preferably a material which can take selection ratio with the second substrate 35, and a material which can function as a passivation film later. As the etching stopper film 34, an $SnO_2$ film, an SrO film, a Teflon film, or a metal film (typified by Pt, Au, W) can be given. Moreover, a silicon nitride film or an silicon oxide film having high barrier characteristics can be provided between the second substrate 35 and the etching stopper film 34 to function as a passivation film.

Next, the second substrate 35 which can function as a support fixing the layer 31 including an element is pasted with a binding material 36. (FIG. 3 (B)) Incidentally, it is preferable to use a substrate higher in rigidity for the second substrate 35 than the first substrate 30. As the binding material 36, a binding material comprising an organic material or a double stick-tape can be used.

Next, the first substrate 30 provided with the metal layer 32 is peeled by a physical means. (FIG. 3 (C)) Since the film stress between the oxide layer and the metal layer 32 is different, it can be peeled-off by comparatively small force.

In this way, the layer 31 including an element formed on the oxide layer 33 can be separated from the first substrate 30. The condition after the peeling is shown in FIG. 3(D).

Next, only the second substrate 35 is removed. (FIG. 3(E)) Here, the second substrate is dissolved by soaking into a container which a mixed solution of hydrofluoric acid (HF) and sulfuric acid ($H_2SO_4$) is in.

In this way, a semiconductor device comprising the layer 31 including an element, the binding material 32, and the etching stopper film 34 is completed on the oxide film 33.

In addition, even though it is not illustrated here, a magnet sheet can be pasted by using a binding material to contact with the etching stopper film 34.

Embodiment Mode 4

Here, an example where a lamination layer of a binding material and an etching stopper film is formed by repeating pasting and removing a substrate is shown. In addition, the same part as the Embodiment 1 is explained by using the same notation.

Figure 4:
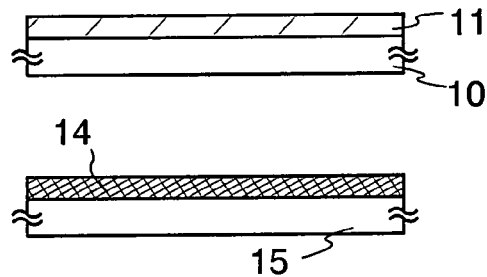
FIG. 4 is a figure which shows a manufacturing process of the present invention. (Embodiment Mode 4)
Figure 4:
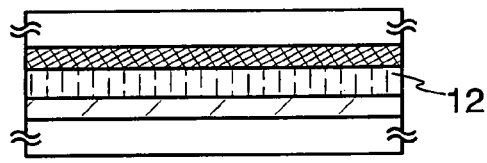
Figure 4:
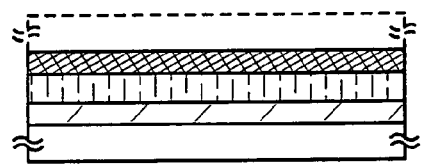
Figure 4:
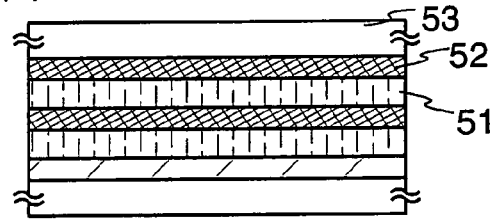
Figure 4:
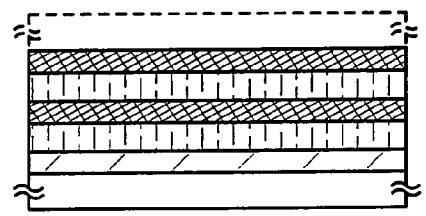

At first, a condition of FIG. 4 (C) is obtained by conducting the same as the Embodiment 1. FIG. 4 (C) corresponds to FIG. 1 (C).

Next, a third substrate 53 provided with an etching stopper film 52 is prepared, then pasted with a binding material 51. (FIG. 4(D)) The same material with the etching stopper film 14 can be used for the etching stopper film 52, or a different type of material can be used.

Next, only the third substrate 53 is removed. (FIG. 4(E)) Here, only the third substrate is dissolved by soaking into a container which a mixed solution of hydrofluoric acid (HF) and sulfuric acid ($H_2SO_4$) is in.

In this way, a semiconductor device comprising the layer 11 including an element, the binding material 12, the etching stopper film 14, the binding material 51, and the etching stopper film 52 is completed on the first substrate 10.

Moreover, layers can be laminated by repeating the process of removing a substrate, after pasting a substrate provided with an etching stopper film with a binding material.

In addition, the present embodiment can be combined with any one of the Embodiments 1 through 3.

Embodiment Mode 5

Figure 12:
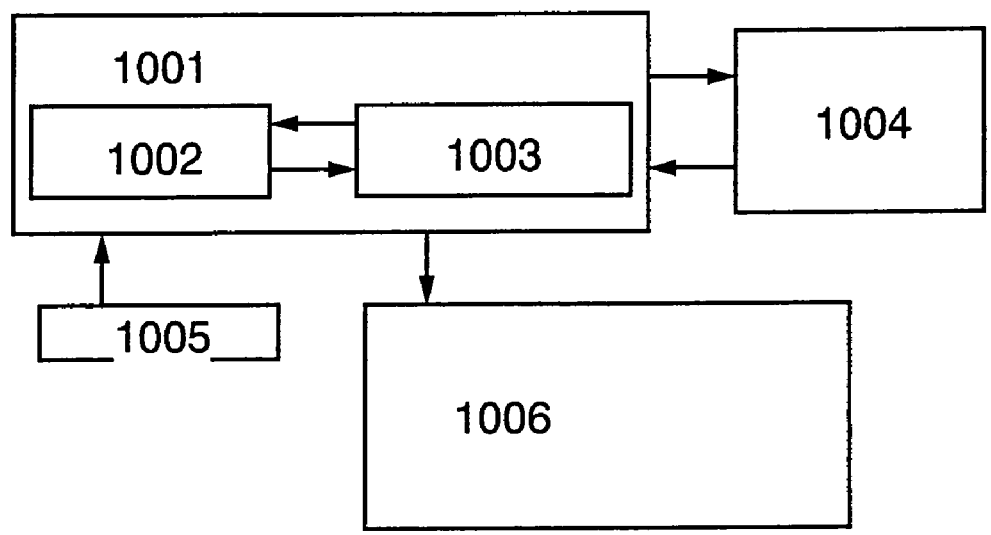
FIG. 12 is a figure showing a block diagram. (Embodiment Mode 5)

Here, an example where a CPU or a memory is formed on a substrate having an insulating surface (typified by a glass substrate, a plastic substrate) is explained by using FIG. 12.

Reference numeral 1001 denotes a central processing unit (also referred to as CPU), reference numeral 1002 denotes a control section, reference numeral 1003 denotes an arithmetic logical unit, reference numeral 1004 denotes a memory unit (also referred to as a memory), reference numeral 1005 denotes an input unit, and reference numeral 1006 denotes an output part (such as a display part).

The central processing unit 1001 is comprised of the arithmetic logical unit 1003 and the control section 1002, and the arithmetic logical unit 1003 is comprised of an arithmetic logical operation unit (an arithmetic logic unit, ALU) conducting an arithmetic operation of addition and subtraction, or a logical operation such as AND, OR, or NOT, various registers temporary storing the data or result of the operation, or a counter counting up the number of input 1. A circuit comprising the arithmetic logical unit 1003 such as an AND circuit, an OR circuit, a NOT circuit, a buffer circuit, or a register circuit can be constituted of TFT. It can be fabricated so that a semiconductor film crystallized with the use of a laser light of continuous oscillation type can be an active layer of TFT, to obtain high electron field-effect mobility. A method of obtaining a polysilicon film by irradiating a continuous oscillation type laser light at an amorphous silicon film, a method of obtaining a polysilicon film by irradiating a continuous oscillation type laser light after obtaining the polysilicon film by heating an amorphous silicon, or a method of obtaining a polysilicon film by adding a metal element which becomes catalyst to an amorphous silicon, followed by obtaining a polysilicon film by heating, then obtaining the polysilicon film by irradiating a continuous oscillation type laser light. In the present embodiment, a channel length direction of TFT comprising the arithmetic logical unit 1003 and a scanning direction of a laser light are aligned.

In addition, the control section 1002 assumes a role to perform an order stored in the memory unit 1004 and to control the whole movement. The control section 1002 comprises a program counter, an order resister, and a control signal generating portion. In addition, the control section 1002 can be comprised of TFT, and a semiconductor film crystallized by using a continuous oscillation type laser light can be fabricated as an active layer of TFT. In the present embodiment, a channel length direction of TFT comprising the control section 1002 and a scanning direction of a laser light are aligned.

In addition, the memory unit 1004 is a place where data and a command for calculating are stored, and data and/or a program frequently executed in CPU are stored. The memory unit 1004 comprises a main memory, an address resister, and a data resister. Moreover, a cash memory can be used in addition to the main memory. These memories can be formed by SRAM, DRAM, or a flash memory or the like. In addition, when the memory unit 1004 is comprised of TFT, a semiconductor film crystallized by using a continuous oscillation type laser light can be fabricated as an active layer of TFT. In the present embodiment, a channel length direction of TFT comprising the memory unit 1004 and a scanning direction of a laser light are aligned.

In addition, the input unit 1005 is a device to take in data or a program from outside. In addition, the output part 1006 is a device, typified by a display device to display a result.

CPU with a little fluctuation can be fabricated on the insulting substrate by aligning a channel length direction of TFT and a scanning direction of a laser light. In addition, CPU and a display can be fabricated on the same substrate. It is preferable to align a channel length direction of a plurality of TFT arranged in each pixel and a scanning direction of a laser light.

In addition, it is possible to form CPU, a display portion, and a memory on the same substrate even though a circuit design or manufacturing step becomes complicated.

In this way, a semiconductor device with a little electric nature fluctuation can be completed on the insulating film.

In addition, the present Embodiment Mode can be combined with any one of the preferred Embodiments 1 through 4.

For example, an etching stopper film is formed on a glass substrate according to any one of the Embodiment Modes 1 through 4, then a large scale integrated circuit (LSI) including CPU or memory is formed thereon, followed by removing an insulating substrate by etching and coping to a plastic film, thereby it can be made light-weight.

In connection with the present invention comprising the aforementioned configuration, it is explained in further detail by using the following embodiments.

EMBODIMENT

Embodiment 1

An example of manufacturing an active matrix light emitting apparatus will be described with reference to FIG. 5 in this embodiment.

The present invention can be applied to an active matrix light-emitting apparatus, but not exclusively, any light-emitting device as long as that has a layer containing an organic compound such as a passive matrix light-emitting apparatus for a color display panel, a surface light source, or an area color light-emitting apparatus for electric spectaculars device.

First, an element is formed on a glass substrate (a first substrate 300). A metal film 301, which is a tungsten film (having a thickness ranging from 10 nm to 200 nm, preferably, from 50 nm to 75 nm) here, is formed on the glass substrate by sputtering, and an oxide film 302, which is a silicon oxide film (having a thickness ranging from 150 nm to 200 nm) here, is stacked thereon without exposing to the air. The tungsten film and the silicon oxide films are formed over the edge portion of the substrate in case of using sputtering. It is preferable that the deposited tungsten film and silicon oxide film are removed selectively by $O_2$ ashing. In the following peeling process, a boundary face of the tungsten film and a silicon oxide film or the internal silicon oxide film is separated.

Next, a silicon oxynitride film as a base insulating film (thickness of 100 nm) is formed by PCVD, and an amorphous silicon film (thickness of 54 nm) is stacked thereon without exposing to the air.

The amorphous silicon film contains hydrogen. In the case of heating at not less than 500° C. the amorphous silicon film to form a polysilicon film, hydrogen can be diffused as well as forming the polysilicon film. Various elements typified by TFT (a thin film diode, and a photoelectric transducer comprising a PIN junctions of silicon, a silicon resistance element, and a sensor element (representatively, a pressure-sensitive fingerprint sensor with the use of polysilicon)) can be formed by using the resulted polysilicon film.

Here, a polysilicon film is formed by using known technique (solid-phase growth, laser crystallization, crystallization using catalyst metal), and an island like semiconductor region is formed by patterning, then, a top gate TFT 303 is formed that uses the island like semiconductor region as an active layer. A gate insulating film is formed, a gate electrode is formed, and a source or a drain region is formed by doping to the active layer, then, an interlayer insulating film is formed, and then, a source or a drain electrode is formed, respectively. Lastly, an activation is carried out.

Next, a film containing an organic compound (hereinafter, referred to as an organic compound layer) is interposed between a pair of electrodes (an anode and a cathode). Then, a first electrode for forming a light-emitting element that can achieve fluorescence or phosphorescence by applying electronic field to the pair of electrodes is formed. Here, the first electrode 304 that can serve as an anode or a cathode is formed of a large work function metal film (Cr, Pt, W, or the like), or a transparent conductive film (indium oxide-tin oxide alloy (ITO), indium oxide-zinc oxide alloy ($In_2O_3$—ZnO), zinc oxide (ZnO), or the like). An example of forming the first electrode 304 for serving as an anode is described.

In case that the source electrode or the drain electrode of a TFT serves as a first electrode, or a first electrode in contact with the source region or the drain region is formed separately, the TFT includes the first electrode.

A partition wall (referred to as a bank, a barrier, a mound and the like) 305a is formed on the edge portion of the first electrode (anode) as encircling the periphery of the first electrode. To improve coverage, the upper edge portion or the bottom edge portion of the partition wall is formed to have a curved surface having curvature. For example, in the case that a positive type photosensitive acrylic is used as a material for the partition wall, it is preferable that only the upper edge portion of the bank is formed to have a curved surface having radius of curvature (from 0.2 to 3 μm). Either a negative type that is an insoluble material in etchant according to light to which photosensitive material is exposed or a positive type that is dissoluble in etchant according to light can be used as the bank 305a.

Further, in the case of stacking a plurality of organic resin, there is threat that a part the plural organic resin is melted or the plural organic resin is too adhesive when applying or burning according to solvent used. Therefore, in the case of using organic resin as a material for the partition wall, the partition wall 305a is preferable to be covered by an inorganic insulating film (a $SiN_x$ film, a $SiN_xO_y$ film, an $AlN_x$ film, or an $AlN_xO_y$ film) in order to make it easy to remove water-soluble resin after coating it over the whole surface in the following process. The inorganic insulating film serves as a part of the bank 305b (FIG. 5(A)).

Next, a binding material that is soluble in water or alcohol is coated over the whole surface and baked. The binding material may be composed of, for example, epoxy series, acrylate series, silicon series, or the like. Here, a film formed of water soluble resin (TOAGOSEI Co., Ltd.: VL-WSHL10) (thickness of 30 μm) 306 is spin-coated, and exposed for two minutes to be partially cured, then, exposed its back to UV rays for 2.5 minutes, and then, exposed its surface for 10 minutes to be fully cured (FIG. 5(B)).

The adhesiveness of the metal film 301 and the oxide film 302 is partly weakened for easy peeling-off. The partly wakening process of adhesiveness is carried out by irradiating a laser light on the region that is to be peeled-off of the metal film 301 or the oxide film 302 along with the periphery thereof, or pressuring locally from outside on the region that is to be peeled-off along with the periphery thereof for damaging the inside or a part of the boundary face of the oxide film 302. Specifically, a hard needle such as a diamond pen may be attached perpendicular to the region with applying loading. Preferably, a scriber device can be used to apply loading on the region with press force ranging from 0.1 to 2 mm. It is important to carry out some processes for easy peeling-off, that is, prepare for peeling-off process. Such preparatory process for weakening selectively (partly) the adhesiveness will prevent poor peeling-off and improve process yield.

Next, a second substrate 308 is bonded to a film formed of water soluble resin 306 with a double-stick tape 307. Then, a third substrate 310 is bonded to the first substrate 300 with a double-stick tape 309 (FIG. 5 (C)). The third substrate 310 prevents the first substrate 300 from damaging in the following peeling-off process. For the second substrate 308 and the third substrate 310, the substrate that has higher rigidity than that of the first substrate 300, for example, a quartz substrate or a semiconductor substrate, is preferably to be used.

The first substrate 300 provided with the metal film 301 is peeled-off from the region, which is partly weakened its adhesiveness by a physical means. The first substrate 300 can be peeled-off by comparatively small force (for example, man's hand, air pressure of gas sprayed from a nozzle, ultrasonic waves, or the like). Thus, the layer to be peeled formed on the oxide layer 302 can be separated from the first electrode 300. FIG. 5 (D) is a state of after peeling-off process.

Figure 5:
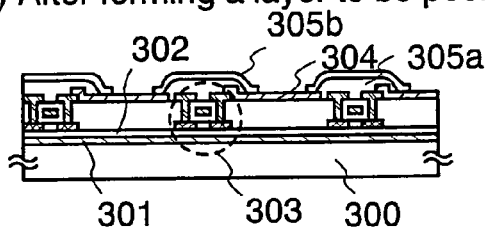
FIG. 5 is a figure showing example 1.
Figure 5:
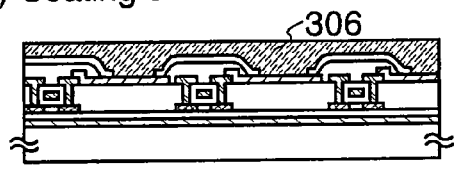
Figure 5:
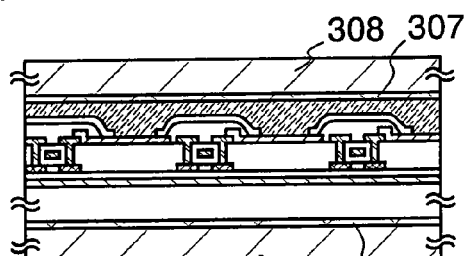
Figure 5:
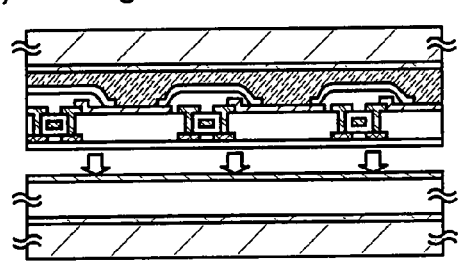
Figure 5:
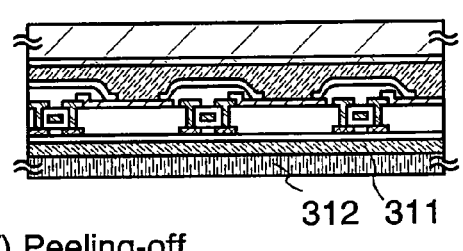
Figure 5:
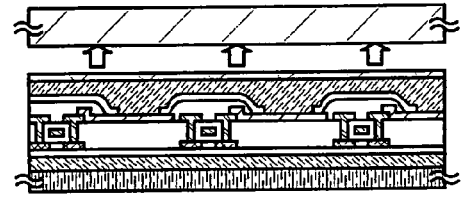
Figure 5:
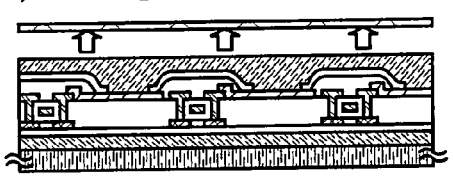
Figure 5:
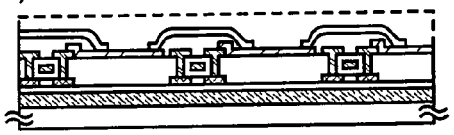
Figure 5:
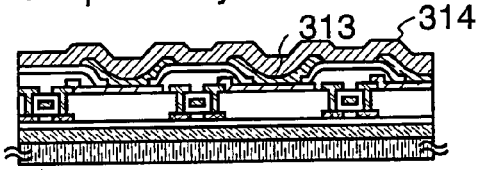
Figure 5:
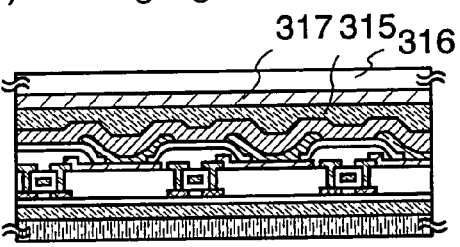
Figure 5:
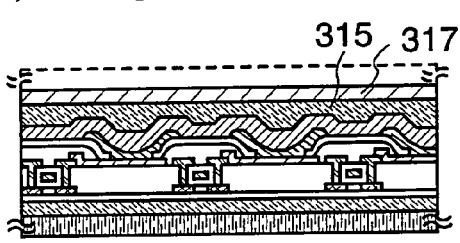
Figure 5:
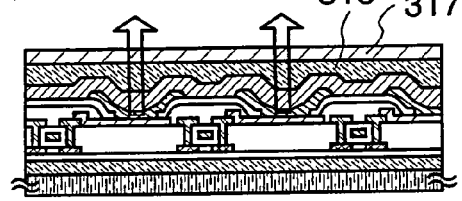

Next, a fourth substrate 312 is bonded to the oxide layer 302 (and the layer to be peeled) with the binding material 311 (FIG. 5 (E)). It is important that the adhesion of the oxide layer 302 (and the release layer) and the fourth substrate 312 is higher than that of the second substrate 308 and the layer to be peeled by the double-stick tape 307.

A flexible plastic substrate is used for the fourth substrate 312. It is preferable to use a plastic substrate comprising polypropylene, polypropylene sulfide, polycarbonate, polyetherimide, polyphenylene sulfide, polyphenylene oxide, poly sulfone, or polyphthalate amide. Here, a polycarbonate substrate (a PC substrate) is used. In addition, a magnet sheet can be used as the fourth substrate.

As the binding material 311, various types of curing adhesive, for example, a reaction-curing adhesive, a heat-curing adhesive, a photo-curing adhesive such as a UV-curing adhesive, or the like, or an anaerobic adhesive is utilized.

The second substrate 308 is separated from the double-stick tape 307 (FIG. 5 (F)).

Then, the double-stick tape 307 is removed (FIG. 5 (G)).

And then, water soluble resin 306 is melted with water and removed (FIG. 5 (H)). If residue of the water soluble resin is left on the first electrode 304, it will cause the deterioration of the device. Consequently, it is preferable that the surface of the first electrode 304 be rinsed or treated in $O_2$ plasma.

If it is necessary, the surface of the first electrode 304 is rubbed and washed by using a porous sponge (typically, a sponge of PVA (polyvinyl alcohol) or nylon) soaked in a surfactant (weak alkaline).

Immediately prior to forming a layer containing an organic compound 313, the substrate is heated in a vacuum for removing absorbed moisture in the whole substrate that is provided with a TFT and a partition wall. Moreover, the first electrode may be exposed to ultraviolet radiation immediately prior to forming the layer containing the organic compound.

The layer containing the organic compound 313 is formed selectively over the first electrode (anode) by vapor deposition using a vapor deposition mask or ink-jet method. As the layer containing the organic compound 313, a polymeric material, a low molecular material, an inorganic material, a mixed layer formed of the above materials, a layer formed by dispersing above materials, or a lamination layer formed by stacking appropriate combination of the above materials.

A second electrode (cathode) 314 is formed on the layer containing the organic compound (FIG. 5(I)). For forming the cathode 314, a lamination layer of a thin film formed of a small work function material (Al, Ag, Li, Ca, or alloy of these materials such as MgAg, MgIn, AlLi, $CaF_2$, or CaN) and a transparent conductive film is utilized. If necessary, a protective layer is formed for covering the second electrode by sputtering or vapor deposition. The protective layer may be formed of a silicon nitride film, silicon oxide film, a silicon nitride oxide film (SiNO film: a ratio of N to O composition is N>O)), or silicon oxynitride (SiON film: a ratio of N to O composition is N<O), or a thin film containing carbon as its main constituent (for example, DLC film, or CN film) formed by sputtering or CVD.

A sealing agent (not shown) containing a gap agent for keeping a space between a pair of substrate is applied in a desired pattern to a fifth substrate 316 that serves as a seal substrate. Here, the glass substrate 316 on which a lamination layer 317 of a barrier film (such as $SiN_x$ film, $SiN_xO_y$ film, $AlN_x$ film, or $AlN_xO_y$ film) and an etching stopper film (SrO film, $SnO_2$ film, or Teflon film) is formed on the surface is used so as to have blocking effect. Next, the seal substrate on which a seal is drawn and an active matrix substrate are glued together, and it is sealed so that the seal pattern provided on the seal substrate surrounds the region of a light-emitting region provided on the active matrix substrate. In addition, the seal substrate is bonded so that the space encircled by the sealing agent is filled with a binding material 315 formed of a transparent organic resin (FIG. 5 (J)).

Next, a fifth substrate 316 which is a glass substrate is removed by etching with etchant to expose a lamination layer 317. (FIG. 5 (K)) For the lamination film 317, it may simply be a material film having transmittance because the present embodiment is an example where a light-emitting element is transmitted to the lamination layer 317.

Through the above steps, a light-emitting device having the TFT and a light-emitting element with the plastic substrate 312 serving as a support is manufactured. (FIG. 5 (L)) The thus obtained semiconductor device is thin, light-weight, and flexible since the support consists of the plastic substrate.

In addition, the present embodiment can be combined with any one of the Embodiments 1 through 4.

Embodiment 2

Figure 6:
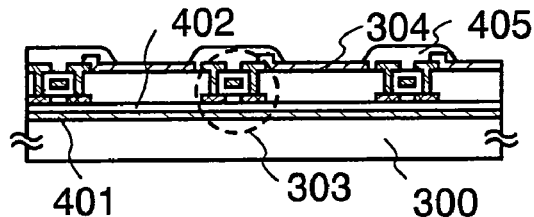
FIG. 6 is a figure showing example 2.
Figure 6:
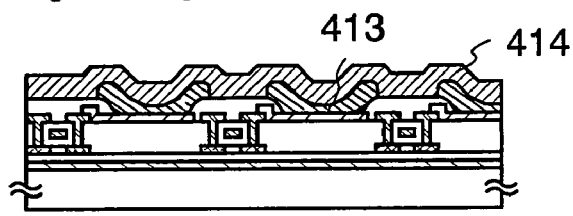
Figure 6:
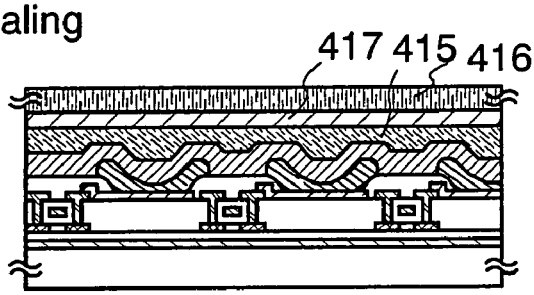
Figure 6:
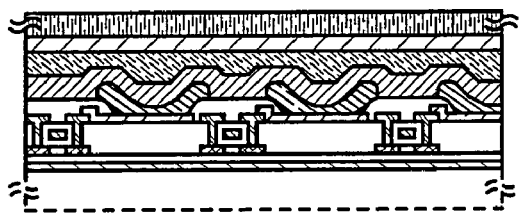
Figure 6:
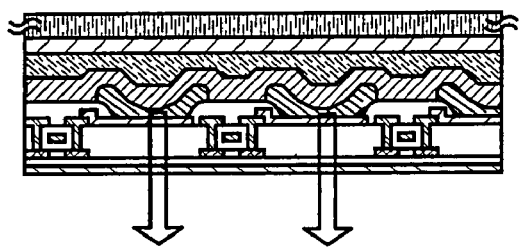

Here, FIG. 6 shows a manufacturing example of a light emitting device in which a light is drawn by transmitting light emitting of a light-emitting element through a first electrode. In addition, the same notation is used in the same part as well as the detailed description is omitted since a part of the process is identical to the Embodiment 1.

At first, an etching stopper film 401 is formed on a first substrate 300. For forming the etching stopper film 401, an SrO film, an $SnO_2$ film, or a Teflon film by a vapor deposition method or sputtering can be used. In addition, the thickness of the etching stopper film 401 is transparent or semitransparent to pass a light-emitting.

Subsequently, a silicon oxynitride film (film thickness 100 nm) becoming a base insulating film 402 is formed by a PCVD method, then an amorphous silicon film (thickness 54 nm) is formed in lamination layer without exposing to air.

In the subsequent processes, the TFT 303 and the first electrode 304 are formed likewise according to the Embodiment 1. In addition, a transparent conductive film is used as the first electrode 304 to transmit a light-emitting. Subsequently, a partition wall 405 is formed with photosensitive acryl of positive type.

Subsequently, if it is necessary, the surface of the first electrode 304 is rubbed and washed by using a porous sponge (typically, a sponge of PVA (polyvinyl alcohol) or nylon) soaked in a surfactant (weak alkaline). In addition, it is preferable to make the surface of the first substrate 304 clean by rinse or an $O_2$ plasma treatment.

Subsequently, a vacuum heating is conducted to remove adsorption moisture on the overall substrate where TFT and a bank are provided right before forming the layer 413 including an organic compound. Moreover, an ultraviolet irradiation may be carried out against the first electrode right before forming a layer containing an organic compound.

Subsequently, the layer 413 containing an organic compound is selectively formed on the first electrode (anode) by a vapor deposition method with the use of a vapor deposition mask, or an ink-jet method. For the layer 413 containing an organic compound, a polymeric material, a low molecular material, an inorganic material, a layer being mixed with these materials, a layer which scatters these materials, or a lamination layer which suitably combines these layers.

In addition, a second electrode (cathode) 414 is formed on the layer containing an organic compound. (FIG. 6 (B)) For forming the cathode 414, a material having a small work function (Al, Ag, Li, Ca, or alloy of these materials such as MgAg, MgIn, AlLi, $CaF_2$, or CaN) may be utilized. If necessary, a protective layer is formed for covering the second electrode by sputtering or vapor deposition. The protective layer may be formed of a silicon nitride film, a silicon oxide film, a silicon nitride oxide film (SiNO film: a ratio of N to O composition is N>O), or SiON film (a ratio of N to O composition is N<O)), or a thin film containing carbon as its main constituent (for example, DLC film, or CN film) formed by sputtering or CVD.

A sealing agent (not shown) containing a gap agent for keeping a space between a pair of substrate is applied in a desired pattern to a second substrate 416 that serves as a seal substrate. Here, a plastic substrate 416 on which a barrier film 417 (such as $SiN_x$ film, $SiN_xO_y$ film, $AlN_x$ film, or $AlN_xO_y$ film) is formed on the surface is used so as to have blocking. Next, the seal substrate on which a seal is drawn and an active matrix substrate are glued together, and it is sealed so that the seal pattern provided on the seal substrate surrounds the region of a light-emitting region provided on the active matrix substrate. In addition, it is bonded so that the space encircled by the sealing agent is filled with the binding material 415 comprising a transparent organic resin. (FIG. 6 (C))

Subsequently, the first substrate 300 which is a glass substrate is removed by etching to expose the etching stopper film 401. (FIG. 6 (D))

Through the above steps, a light emitting device having TFT and a light-emitting element with the plastic substrate 416 serving as a supporter can be manufactured. (FIG. 6 (E))

In addition, the present embodiment can be combined with any one of the Embodiment modes 1 through 4, or the Embodiment 1.

Embodiment 3

Figure 7:
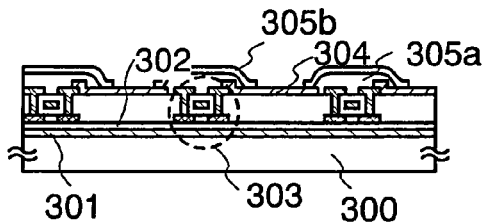
FIG. 7 is a figure showing example 3.
Figure 7:
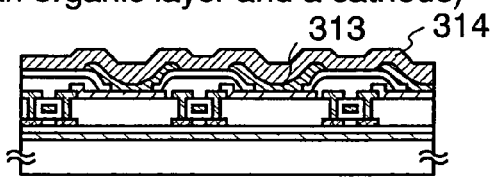
Figure 7:
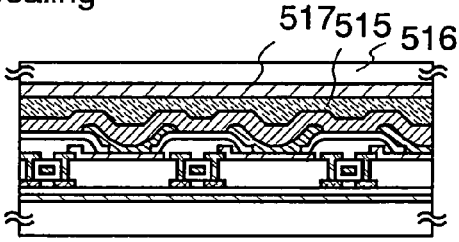
Figure 7:
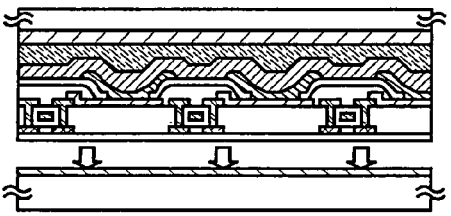
Figure 7:
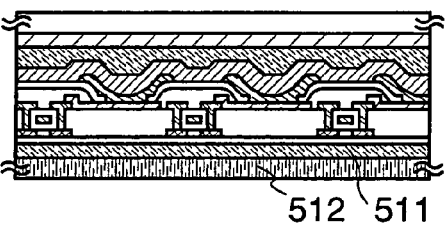
Figure 7:
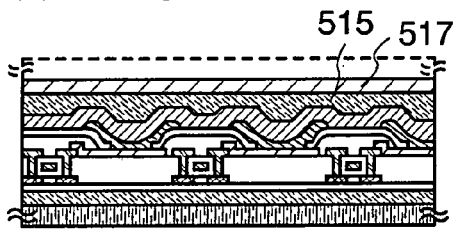
Figure 7:
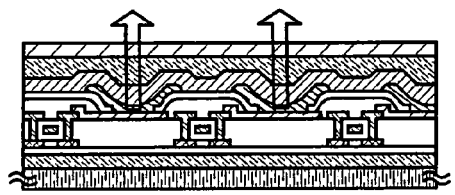

In the present embodiment, an example is shown in FIG. 7 in which the process order is different from the Embodiment 1. In addition, the same notation is used in the same part as well as the detailed description is omitted since a part of the process is identical to the Embodiment 1.

At first, according to the embodiment 1, the metal layer 301, the oxide film 302, the TFT 303, the first electrode 304, the bank 305a, and 305b are formed on the first substrate 300 which is a glass substrate. (FIG. 5 (A)) In addition, FIG. 7 (A) is identical to FIG. 5 (A).

Subsequently, if it is necessary, the surface of the first electrode 304 is rubbed and washed by using a porous sponge (typically, a sponge of PVA (polyvinyl alcohol) or nylon) soaked in a surfactant (weak alkaline).

Subsequently, a vacuum heating is conducted to remove adsorption moisture on the overall substrate where TFT and a bank are provided right before forming the layer 313 containing an organic compound. Moreover, an ultraviolet irradiation may be carried out against the first electrode right before forming a layer including an organic compound.

Subsequently, the layer 313 is selectively formed including an organic compound on the first electrode (anode) by a vapor deposition method with the use of a vapor deposition mask, or an ink-jet method.

In addition, the second electrode (cathode) 314 is formed on the layer containing an organic compound. (FIG. 7 (B)) If necessary, a protective layer is formed for covering the second electrode by sputtering or a vapor deposition method.

Subsequently, sealing agent (not shown) containing a gap agent for keeping a space between a pair of substrate is applied in a desired pattern to a quartz substrate 516 provided with an etching stopper film 517. In addition, it is sealed so that a binding material 515 comprising a transparent organic resin is filled in a space surrounded by a sealing agent. (FIG. 7 (C))

Subsequently, a process which partially decreases adhesion of the metal film 301 and the oxide film 302 is conducted so that the later peeling can be easily conducted. Subsequently, a region where the adhesion is partially decreased is peeled, then the first substrate 300 provided with the metal film 301 is peeled by a physical means. It can be peeled-off by comparatively small force (for example, man's hand, air pressure of gas sprayed from a nozzle, ultrasonic waves, or the like). In this way, a layer to be peeled formed on the oxide layer 302 can be separated from the first substrate 300. The condition after peeling is shown in FIG. 7 (D).

Subsequently, a third substrate 512 and the oxide layer 302 (and a layer to be peeled) are adhered with the binding material 511. (FIG. 7 (E)) As the binding material 511, various types of curing adhesive, for example, a reaction-curing adhesive, a heat-curing adhesive, a photo-curing adhesive such as a UV-curing adhesive, or the like, or an anaerobic adhesive is utilized.

For the third substrate 512, it is preferable to use a plastic substrate comprising polypropylene, polypropylene sulfide, polycarbonate, polyetherimide, polyphenylene sulfide, polyphenylene oxide, poly sulfone, or polyphthalate amide. Here, a polycarbonate substrate (a PC substrate) is used. In addition, a magnet sheet can be used as the third substrate.

Subsequently, the second substrate 516 which is a quartz substrate is removed by etching with etchant to expose the etching stopper film 517. (FIG. 7 (F)) The etching stopper film 517 may be simply a material film having transmittance since the present embodiment is an example in which a light-emitting of a light-emitting element is transmitted to the etching stopper film 517.

Through the above steps, a semiconductor device having the TFT and a light-emitting element with the plastic substrate 512 serving as a support is manufactured. (FIG. 7 (G)) The thus obtained semiconductor device is thin, light-weight, and flexible since the support consists of the plastic substrate.

In addition, the present embodiment can be combined with any one of the Embodiment modes 1 through 4, or the Embodiment 1.

Embodiment 4

Figure 8:
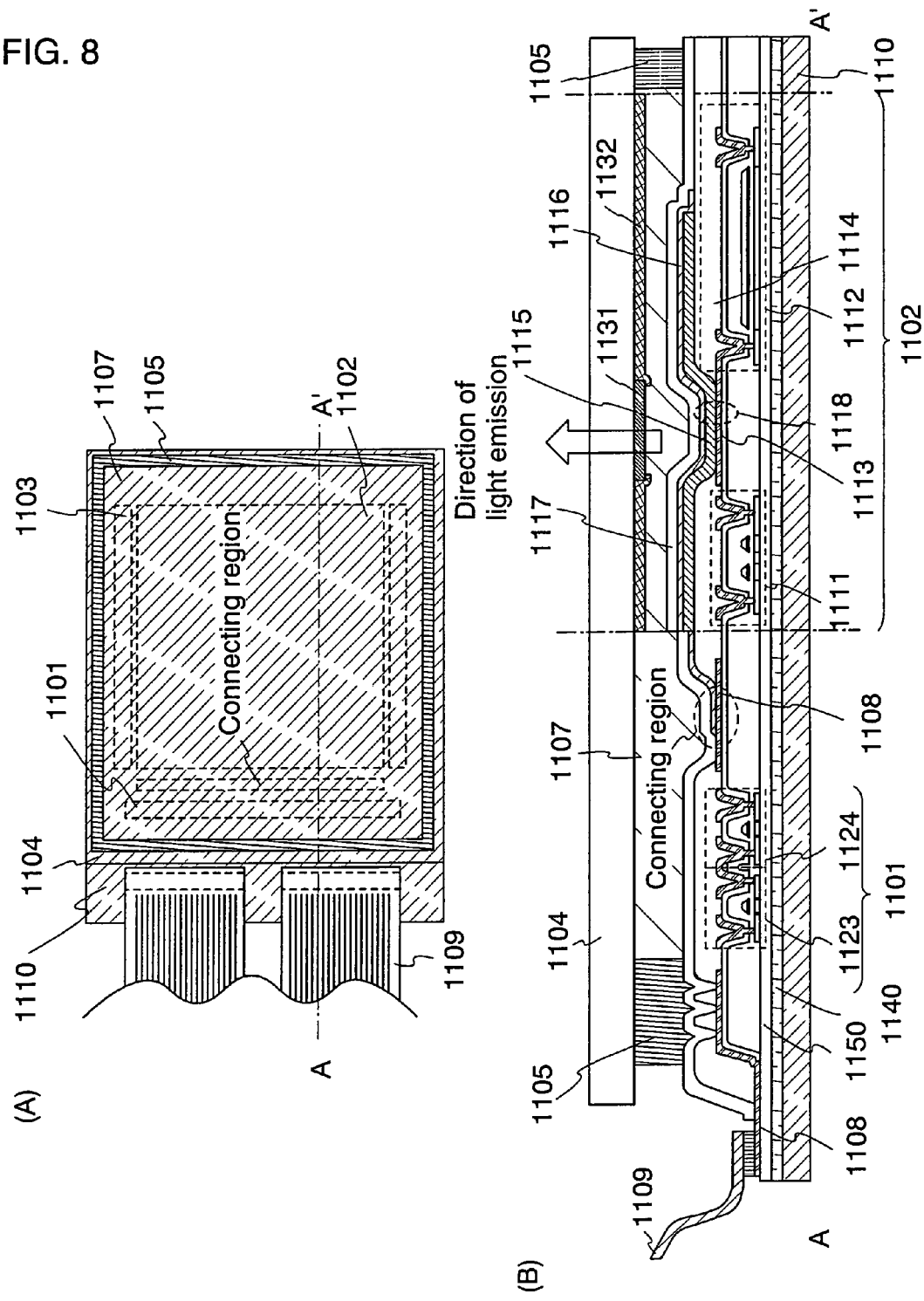
FIG. 8 is a top view and a sectional view of a light-emitting device. (Embodiment 4)

In FIG. 8, shown is an example of manufacturing a light emitting device (having an top emission constitution) provided over a magnet sheet in which an organic compound layer is allowed to be a light emitting layer.

FIG. 8(A) is a top view of the light emitting device, while FIG. 8(B) is a cross-sectional view taken along a line A-A' in FIG. 8(A). Reference numeral 1101 indicated by a dotted line denotes a source signal line driver circuit; reference numeral 1102 denotes a pixel portion; and reference numeral 1103 denotes a gate signal line driver circuit. Further, reference numeral 1104 denotes a transparent sealed substrate; reference numeral 1105 denotes a first sealing material; and reference numeral 1107 denotes a transparent second sealing material which fills an inside of an area surrounded by the first sealing material 1105. The first sealing material 1105 contains a gap material for securing a space between substrates.

Reference numeral 1108 denotes a wiring for transmitting a signal to be inputted to the source signal line driver circuit 1101 and the gate signal line driver circuit 1103. The wiring 1108 receives a video signal or a clock signal from FPC (a flexible print circuit) 1109 which becomes an external input terminal. Although only the FPC is shown, a printed wiring board (PWB) may be attached to the FPC.

Subsequently, a cross-sectional constitution will be described with reference to FIG. 8(B). A driver circuit and a pixel portion are formed over a flexible magnet sheet 1110 through a lamination film 1150 of a base insulating film and an etching stopper film, and a binding material 1140, but the source signal line diver circuit 1101 as the driver circuit and the pixel portion 1102 are shown. The magnet sheet 1110 is a substrate formed in a shape of a sheet, after an organic polymer compound such as plastic and a binder are mixed with barium ferrite, strontium ferrite, or powder of rare earth magnet.

In the source signal line driver circuit 1101, a CMOS circuit in which an n-channel type TFT 1123 and a p-channel type TFT 1124 are combined is formed. In addition, these TFT can be obtained according to the Embodiment mode 5. The TFT which constitutes the driver circuit may be formed by at least one circuit selected from the group consisting of: a CMOS circuit, a PMOS circuit and an NMOS circuit which are publicly known in the art. In the present embodiment, a driver-integrated type in which the driver circuit is formed over the substrate is shown, but the driver-integrated type may not necessarily be adopted. The driver circuit can also be formed outside instead of being formed over the substrate. A constitution of the TFT using a polysilicon film as an active layer is not particularly limited thereto, either a top gate type TFT or a bottom gate type TFT is permissible.

The pixel portion 1102 is formed by a plurality of pixels each of which comprises a switching TFT 1111, a current-controlling TFT 1112 and a first electrode (anode) 1113 which is electrically connected to the drain of the current-controlling TFT 1112. The current-controlling TFT 1112 may either be an n-channel type TFT or a p-channel type TFT, but when it is to be connected to the anode, it is preferably the p-channel type TFT. It is also preferable that a retention volume (not shown) is appropriately used. In addition, while an example in which only a cross-sectional constitution of one pixel among innumerably arranged pixels is shown where two TFTs are used in the pixel is shown, three or more TFTs can appropriately be used per pixel.

Since it is constituted such that the first electrode 1113 is directly connected to the drain of the TFT, it is preferable that a lower layer of the first electrode 1113 is allowed to be a material layer which can have an ohmic contact with the drain comprising silicon, while an uppermost layer thereof which contacts a layer containing an organic compound is allowed to be a material layer which has a large work function. For example, a three-layer constitution contained of a titanium nitride film, a film containing aluminum as a primary component, and a titanium nitride film, can have a low resistance of wiring, a favorable ohmic contact, and also, can function as an anode. Further, the first electrode 1113, a monolayer of at least one film selected from the group consisting of: a titanium nitride film, a chromium film, a tungsten film, a zinc film, a platinum film and the like, or a laminate of two layers or more may be used.

An insulating substance 1114 (referred to as a bank, a partition wall, a barrier, a mound or the like) is formed over each end of the first electrode (anode) 1113. The insulating substance 1114 may be formed by either an organic resin film or an insulating film comprising silicon. In the present embodiment, as for the insulating substance 1114, an insulating substance is formed in a shape as shown in FIG. 8 by using a positive type photosensitive acrylic resin film.

For the purpose of enhancing a coverage effect, a curved surface having a curvature is to be formed in an upper end portion or a lower end portion of the insulating substance 1114. For example, when the positive type photosensitive acryl is used as a material for the insulating substance 1114, it is preferable that a curved face having a curvature radius (0.2 μm to 3 μm) is provided only to the upper end portion of the insulating substance 1114. As for the insulating substance 1114, either one of a negative type which becomes insoluble to an etchant by photosensitive light, or a positive type which becomes soluble to the etchant by the light can be used.

Further, the insulating substance 1114 may be covered by a protective film comprising at least one film selected from the group consisting of: an aluminum nitride film, an aluminum oxynitride film, a thin film containing carbon as a primary component, or a silicon nitride film.

A layer 1115 containing an organic compound is selectively formed over the first electrode (anode) 1113 by a vapor deposition method with the use of a vapor deposition mask, or an ink-jet method. Further, a second electrode (cathode) 1116 is formed over the layer 1115 containing the organic compound. As for the cathode, a material having a small work function (for example Al, Ag, Li, Ca, alloys of thereof, that is, MgAg, MgIn, AlLi, $CaF_2$, or CaN) may be used. In the present embodiment, in order to allow luminescence to pass through, as for the second electrode (cathode) 1116, a laminate of a metal thin film which is thin in film thickness, and a transparent conductive film (such as an indium oxide-tin oxide alloy (ITO), an indium oxide-zinc oxide alloy ($In_2O_3$—ZnO), or zinc oxide (ZnO)) is used. Then, a light-emitting element 1118 comprising the first electrode (anode) 1113, the layer containing an organic component 1115, and the second electrode (cathode) 1116 is fabricated. In the present embodiment, the light-emitting element 1118 is allowed to be an example of emitting white light, and therein, a color filter (for the purpose of simplicity, an overcoat layer is not shown) comprising a colored layer 1131 and a light blocking layer (BM) is provided.

Further, when layers each containing an organic compound which can obtain R, G, and B luminescence respectively, are selectively formed, a full-color display can be obtained without using a color filter.

A transparent protective layer 1117 is formed in order to seal the light-emitting element 1118. It is preferable to use an insulating film containing silicon nitride or silicon nitride oxide as a primary component, a thin film containing carbon as a primary component (a DLC film, a CN film), or a lamination layer of these obtained by sputtering (a DC method or a RF method) or a PCVD method. A silicon nitride film with high blocking effect against impurities such as moisture or an alkali metal can be obtained if it is formed in an atmosphere including nitride and argon by using a silicon target. In addition, a silicon nitride target may be used. In addition, the transparent protective layer may be formed by using a deposition device with the use of remote plasma. In addition, it is preferable to make the film thickness of the transparent protective layer thin as much as possible to pass luminescence through the transparent protective layer.

Further, in order to seal the light-emitting element 1118, the sealed substrate 1104 is bonded thereto by using a first sealing material 1105 and a second sealing material 1107 in an inert gas atmosphere. As for the first sealing material 1105 and the second sealing material 1107, it is preferable that an epoxy resin is used. It is also preferable that the first sealing material 1105 and the second sealing material 1107 are each made of a material which does not allow moisture or oxygen to penetrate as much as possible.

In addition, in the present embodiment, the magnet sheet 1110 is glued after the sealed substrate 1104 is pasted, then a glass substrate or a quartz substrate is removed by etching. The lamination layer 1150 comprising the base insulating film and the etching stopper film is exposed by etching. Therefore, in the present embodiment, for a material constructing the sealing substrate 1104, a plastic substrate comprising a material which is not removed by etching of the glass substrate is used. After the sealed substrate 1104 is bonded by using the first sealing material 1105 and the second sealing material 1107, it is possible to perform sealing by using a third sealing material such that a side face (exposed face) is covered.

By sealing the light-emitting element by using the first sealing agent 1105 and the second sealing agent 1107 as described above, the light-emitting element can thoroughly be shielded from outside. In consequence, substance, such as moisture and oxygen, which will deteriorate the organic compound layer can be prevented from entering from outside. In addition, it is possible to maintain adhesive power by attracting a wiring comprising metal with the magnetic force of the magnet sheet 1110. Accordingly, a light-emitting device having high reliability can be obtained.

In addition, the present embodiment can be combined with any one of the Embodiment modes 1 through 3, or the Embodiment 1.

Embodiment 5

In the Embodiment 4, an example of a constitution in which a layer containing an organic compound is formed over an anode and a cathode which is a transparent electrode is formed over a layer containing an organic compound (hereinafter, referred to as a top emission constitution) was shown; however, in the present embodiment, a constitution in which a layer containing an organic compound is formed over an anode and a light-emitting element in which a cathode is formed over the organic compound layer, and luminescence generated in the layer containing a organic compound is drawn from the anode which is a transparent electrode to TFT (hereinafter, bottom emission constitution), may also be permissible.

Figure 9:
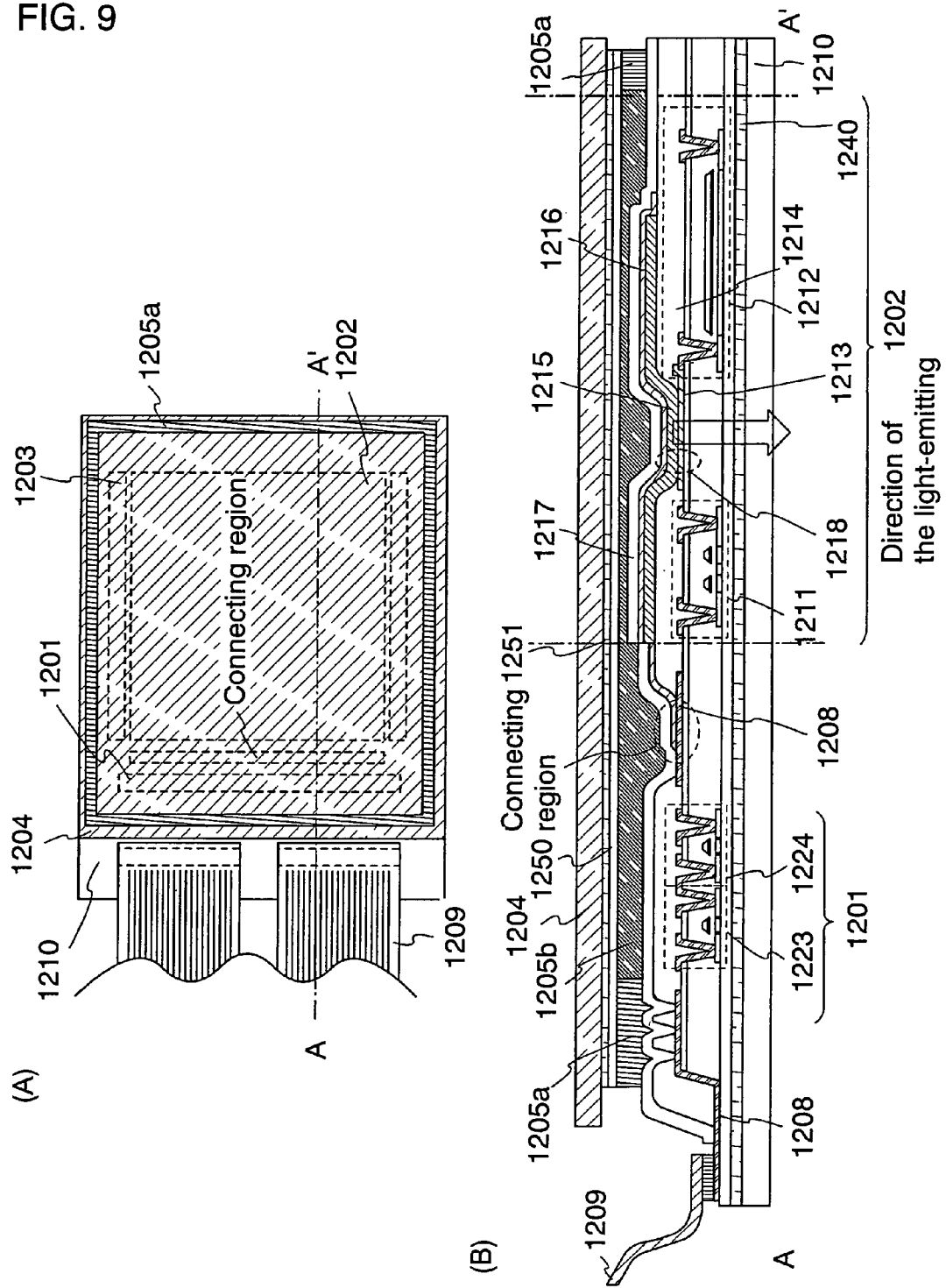
FIG. 9 is a top view and a sectional view of a light-emitting device. (Embodiment 5)

An example of a light-emitting device having a bottom emission constitution is shown in FIG. 9.

In addition, FIG. 9 (A) is a top view of the light emitting device, while FIG. 9 (B) is a cross-sectional view taken along a line A-A' in FIG. 9 (A). Reference numeral 1201 indicated by a dotted line denotes a source signal line driver circuit; reference numeral 1202 denotes a pixel portion; and reference numeral 1203 denotes a gate signal line driver circuit. In addition, reference numeral 1204 denotes a magnet sheet; and a reference numeral 1205a is a sealing agent containing a gap material to keep a space between a pair of substrates and an inside of an area surrounded by the sealing material 1205 a is filled with a sealing material 1205b. Desiccant may be arranged inside the sealing material 1205.

A connecting wiring 1208 denotes a wiring for transmitting a signal to be inputted to the source signal line driver circuit 1201 and the gate signal line driver circuit 1203. The wiring 1208 receives a video signal or a clock signal from an FPC (flexible print circuit) 1209 which becomes an external input terminal.

Subsequently, a sectional constitution will be described with reference to FIG. 9(B). A driver circuit and the pixel portion are formed on a substrate 1210 having transmittance through a binding material 1240, but the source signal line driver circuit 1201 as the driver circuit and the pixel portion 1202 are shown. In the source signal line driver circuit 1201, a CMOS circuit in which an n-channel type TFT 1223 and a p-channel type TFT 1224 are combined is formed.

The pixel portion 1202 is formed by a plurality of pixels each of which comprises a switching TFT 1211, a current-controlling TFT 1212 and a first electrode (anode) 1213 comprising a transparent conductive film which is electrically connected to a drain of the current-controlling TFT 1212.

In the present embodiment, it is constituted such that the first electrode 1213 is formed such that a part thereof is overlapped with a connecting electrode and the first electrode 1213 is electrically connected to a drain region of the TFT via a connecting electrode. It is preferable that the first electrode 1213 has transparency and an electrically conductive film having a large work function (for example, such as ITO (an indium oxide-tin oxide alloy), an indium oxide-zinc oxide alloy ($In_2O_3$—ZnO), or zinc oxide (ZnO)) is used.

An insulating substance 1214 (referred to as a bank, a partition, a barrier, a mound or the like) is formed over each end of the first electrode (anode) 1213. For the purpose of enhancing a coverage effect, a curved surface having a curvature is allowed to be formed in an upper end portion or a lower end portion of the insulating substrate 1214. Further, the insulating substance 1214 may be covered by a protective film comprising at least one film selected from the group consisting of: an aluminum nitride film, an aluminum oxynitride film, a thin film containing carbon as a primary component, and a silicon nitride film.

A layer 1215 containing an organic compound is selectively formed over the first electrode (anode) 1213 by a vapor deposition method using a vapor deposition mask or ink-jet method. Further, a second electrode (cathode) 1216 is formed over the layer 1215 containing the organic compound. As for the cathode, a material having a small work function (for example Al, Ag, Li, Ca, alloys of thereof, that is, MgAg, MgIn, AlLi, $CaF_2$, or CaN) may be used. Then, a light-emitting element 1218 comprising the first electrode (anode) 1213, the layer 1215 containing the organic compound, and the second electrode (cathode) 1216 is fabricated. The light-emitting element 1218 emits a light in a direction which an arrow shows in FIG. 9. The light-emitting element 1218 in the present embodiment is one type of light-emitting element which can obtain mono-color luminescence of R, G, or B. Three of such light-emitting elements as described above, in each of which a layer containing an organic compound capable of obtaining one of R, G, and B luminescence is selectively formed, are combined to obtain full-color luminescence.

Further a protective layer 1217 is formed in order to seal the light-emitting element 1218. As for the transparent protective layer 1217, it is preferable to use an insulating film containing silicon nitride or silicon nitride oxide as a primary component obtained by sputtering (a DC method or a RF method) or a PCVD method, or a thin film containing carbon as a primary component (such as a DLC film or a CN film), or a lamination layer of these. A silicon nitride film with high blocking effect against impurities such as moisture or an alkali metal can be obtained if it is formed in an atmosphere including nitride and argon by using a silicon target. In addition, a silicon nitride target may be used. In addition, the protective layer may be formed by using a deposition device with the use of remote plasma.

Further, in order to seal the light-emitting element 1218, after a glass substrate on which the etching stopper film 1205 is formed by the sealing material 1205a, 1205b in an inert gas atmosphere is pasted, and the glass substrate is removed by etching, the magnet sheet substrate 1204 is pasted with a binding material 1251. In addition, as for the sealing material 1205a and 1205b, it is preferable that an epoxy resin is used. It is also preferable that the 1205a and 1205b are each made of a material which does not allow moisture or oxygen to penetrate as much as possible.

In addition, the substrate 1210 is a substrate glued after the TFT is formed. In addition, the substrate before pasting the substrate 1210 is removed or peeled by a peeling method, for example, a method shown in the Embodiment modes 1 through 4.

In addition, the present embodiment can be combined with any one of the Embodiment modes 1 through 3, or the Embodiment 1 or the Embodiment 2.

Embodiment 6

In this embodiment, a cross sectional structure of one pixel, particularly connections with regard to a light-emitting element and TFT, and a shape of a partition wall to be provided between pixels will be described.

Figure 10:
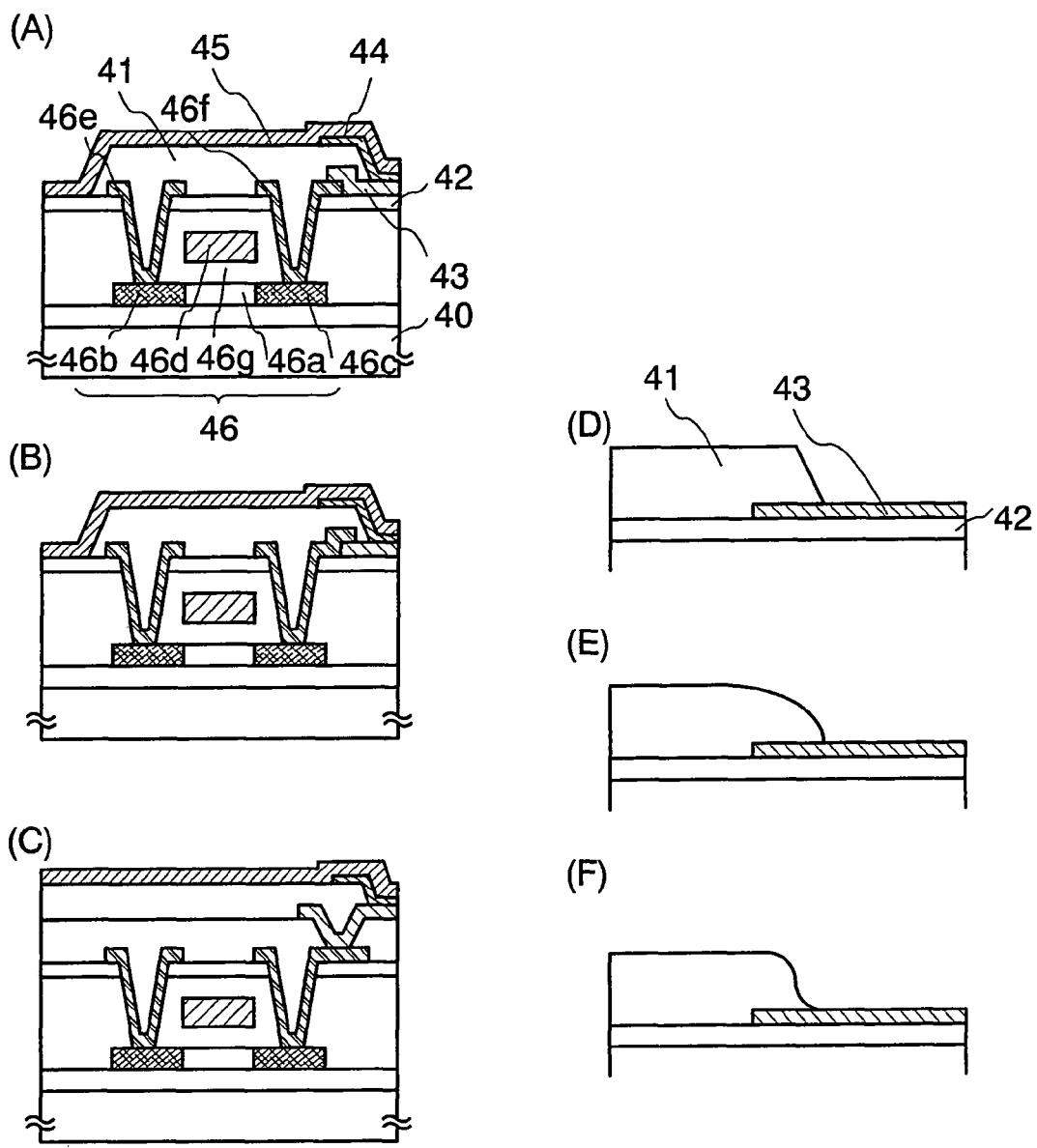
FIG. 10 is a figure explaining a connection with TFT and a first electrode, and bank configuration. (embodiment 6)

In FIG. 10(A), reference numeral 40 denotes a substrate, 41 denotes a partition wall (referred to also as "mound"), 42 denotes an insulating film, 43 denotes a first electrode (anode), 44 denotes a layer containing an organic compound, 45 denotes a second electrode (cathode), and 46 denotes TFT.

In the TFT reference numerals 46, 46a denotes a channel forming region, 46b and 46c each denote a source region or a drain region, 46d denotes a gate electrode, 46e and 46f each denote a source electrode or a drain electrode. Although top-gate type TFT is described in this embodiment, the TFT is not limited to a particular type and reverse stagger type TFT or a regular stagger type TFT is permissible. Further, 46f denotes the electrode which is connected with the TFT 46 by allowing the 46f to be in partial contact with the first electrode 43 in an overlapping manner.

In FIG. 10(B), a cross sectional structure which is partially different from that shown in FIG. 10(A) is shown.

In FIG. 10(B), the overlapping manner between the first electrode and the electrode is different from that as shown in FIG. 10(A), after patterning the first electrode, the electrode is formed such that it is partially lapped over the first electrode to allow the electrode to be connected with the TFT.

In FIG. 10(C), a cross sectional structure which is partially different from that shown in FIG. 10(A) is shown.

In FIG. 10(C), an additional interlayer insulating layer is further provided whereupon the first electrode is connected with the electrode of the TFT via a contact hole.

Further, a cross sectional shape of the partition wall 41 may be of a tapered one as shown in FIG. 10(D). Such shape can be obtained by first exposing a resist to light by using a photolithography method and, then, etching a non-photosensitive organic resin or an inorganic insulating film.

Still further, when a positive-type photosensitive organic resin is used, as shown in FIG. 10(E), a shape having a curved surface on a top end thereof can be obtained.

On the contrary, when a negative-type photosensitive resin is used, as shown in FIG. 10(F), a shape having a curved surface on each of top and bottom ends thereof can be obtained.

The embodiment can freely be combined with any one of Embodiment Modes 1 through 3 and Embodiments 1 through 5.

Embodiment 7

In this embodiment, an example in which an integrated circuit typified by CPU is copied is shown in FIG. 7.

At first, an etching stopper film 901 is formed on a first substrate 900 and a base insulating film 902 is formed thereupon. Subsequently, such as a semiconductor element, an n-channel type TFT 903b, a p-channel type TFT 903b, a storage capacitor portion 906, a terminal portion (not shown) are formed on the base insulating film 902. A CMOS circuit is formed if the n-channel type TFT 903b and the p-channel type TFT 903a are combined complementarily, thereby various types of integrated circuits can be composed. For example, a memory circuit such as SRAM can also be fabricated. Therefore, a central processing unit (referred to also as a CPU) which merged an arithmetic logical unit (including an AND circuit, an OR circuit, a NOT circuit, a buffer circuit or a register circuit) with a control section (including a program counter, an instruction register or a control signal generating portion) on the first substrate 900 can be fabricated. In addition, with regard to the CPU, a detailed description is omitted here because it was explained in the Embodiment mode 5.

Figure 11:
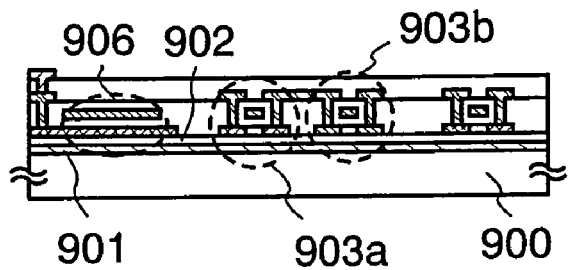
FIG. 11 is a figure showing a manufacturing process of the present invention. (Embodiment 7)
Figure 11:
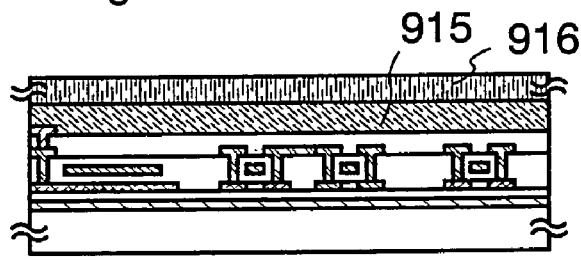
Figure 11:
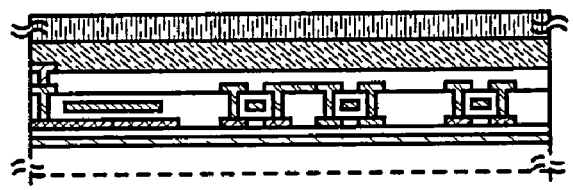
Figure 11:
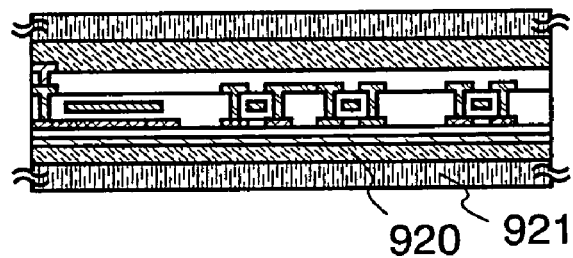
Figure 11:
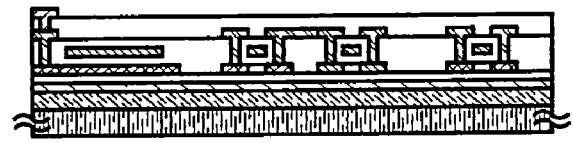

Subsequently, such as a leading wiring (not shown) or an output-input terminal is suitably formed, after an insulating film covering these elements is formed. (FIG. 11 (A))

Subsequently, a second substrate 916 is pasted with a binding material 915 (a removable binding material, for example, a water soluble adhesive, or a double-stick tape). As forming the second substrate 916, if it is a tabular base material comprising a material which can take selection ratio in the later etching, it is not limited particularly. (FIG. 11 (B))

Subsequently, the first substrate 900 is removed by etching to expose the etching stopper film 901. In the present embodiment, only the first substrate 900 which is a glass substrate is dissolved with the mixed solution of hydrofluoric acid (HF) and sulfuric acid ($H_2SO_4$). (FIG. 11 (C)).

Subsequently, a third substrate 921 comprising plastic is pasted with a binding material 920 so that the substrate contacts the etching stopper film 901. (FIG. 11(D)) As for the substrate 921 comprising plastic, it is not limited to whether it has translucency or not particularly.

Subsequently, the second substrate 916 is removed by removing the binding material 915. Thus, a semiconductor device having the binding material 920, the etching stopper film 901 and an integrated circuit (such as a CPU) is completed on the third substrate 921.

Figure 13:
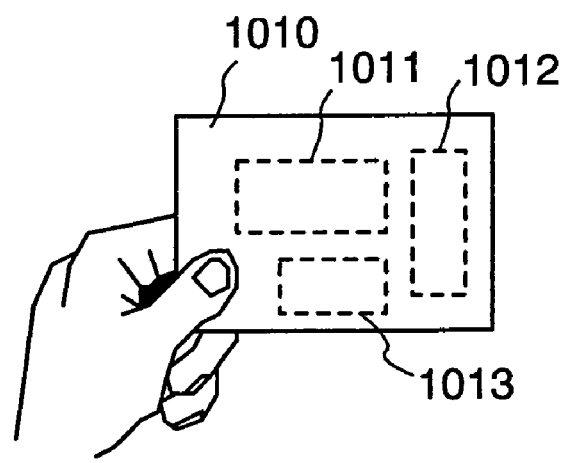
FIG. 13 is a figure showing a card type electronics device. (Embodiment 7)

In addition, a card-type electronics device shown in FIG. 13 can be fabricated if a plastic substrate of card size is used as the third substrate 921. For example, when it is assumed an authentication card, reference numeral 1010, reference numeral 1011, reference numeral 1012 and reference numeral 1013 can be buried as a card base material, a CPU including a memory circuit to acquire information, a data output-input portion and a battery (for example, a solar battery), respectively. The CPU is pasted on the plastic substrate in the aforementioned process thereby a whole device can be further thinned.

In addition, when it is assumed a card type game electronics device, reference numeral 1010, reference numeral 1011, reference numeral 1012 and reference numeral 1013 may be a card base material, a display portion, a driver circuit and a CPU in which a game program is operable, respectively. It can be further thinned because these display portions, driver circuit portions, CPU can be all formed on the plastic substrate.

In addition, the present embodiment can be freely combined with any one of the Embodiment modes 1 through 5, or the Embodiments 1 through 5.

Embodiment 8

Various semiconductor modules (an active matrix type EL module, a reflection type liquid crystal display device or an active matrix type EC module) can be completed by applying the present invention. That is, by carrying out the present invention, all electronics devices which incorporate these are completed.

Figure 14:
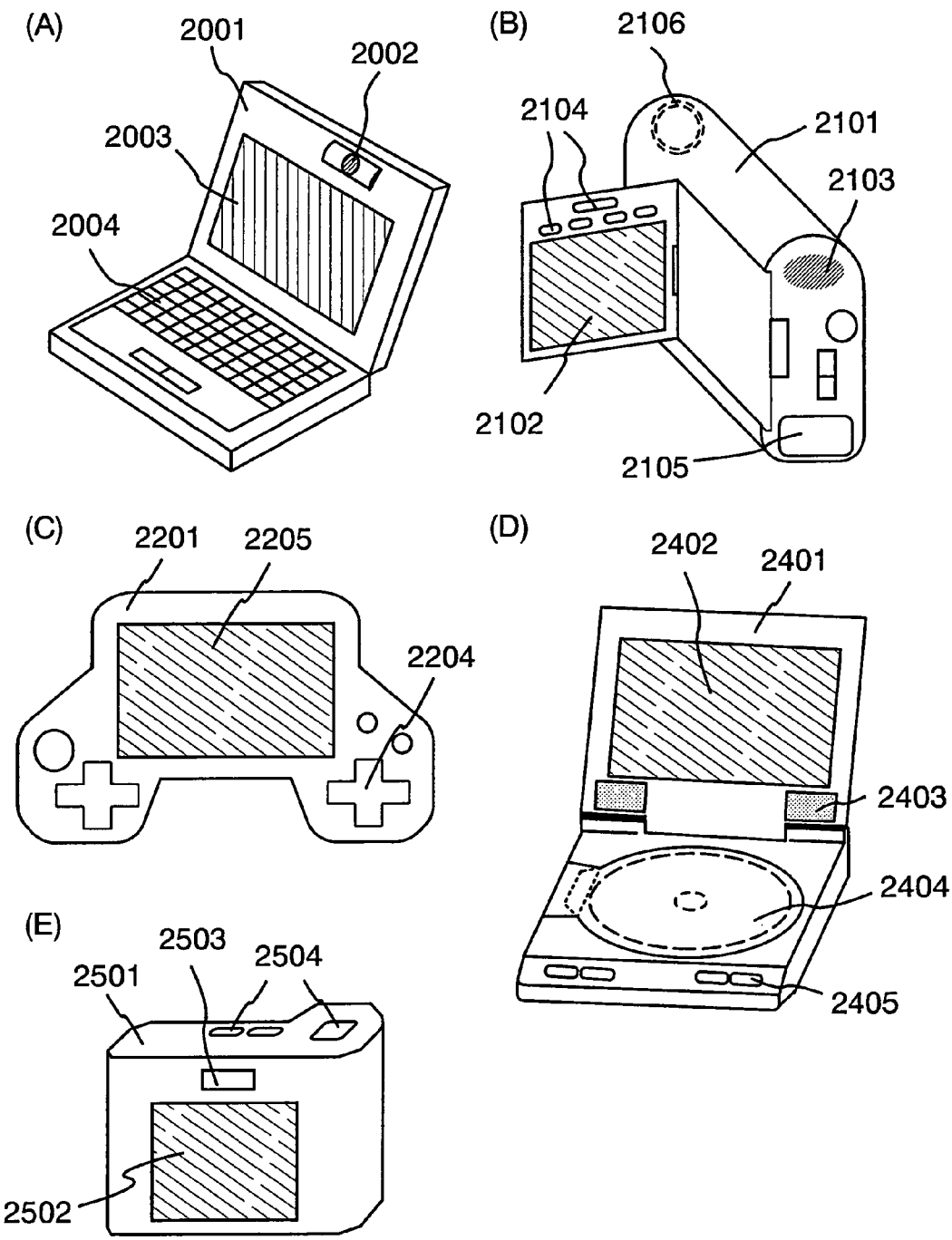
FIG. 14 is a figure showing an example of electronics devices. (embodiment 8)
Figure 15:
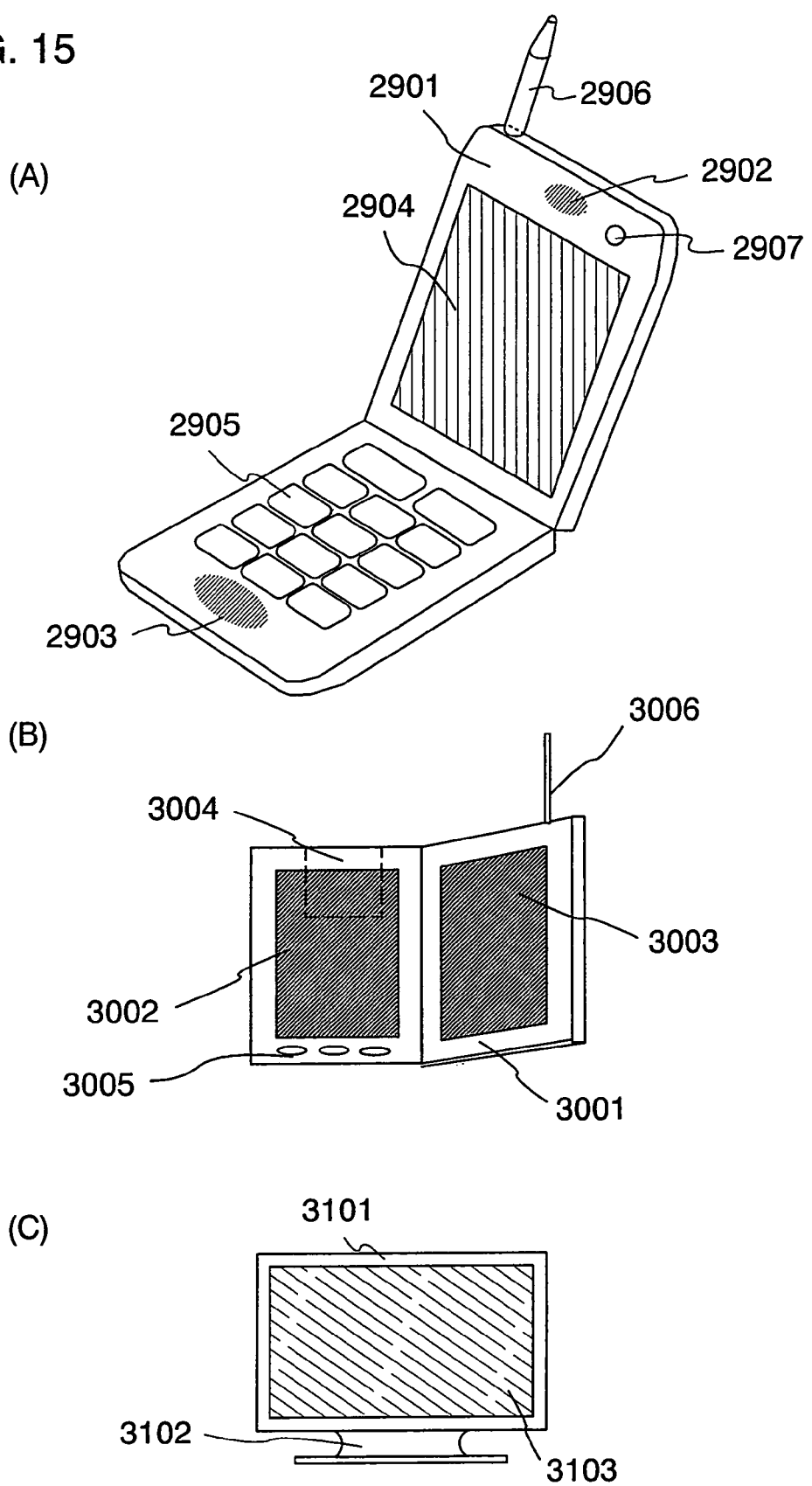
FIG. 15 is a figure showing an example of electronics devices. (Embodiment 8)

Such electronics device is a video camera, a digital camera, a head-mounted display (goggle type display), a car navigation system, a projector, a car stereo, a personal computer, or a mobile information terminal (such as a mobile computer, a mobile telephone or an electronic book). FIG. 14 and FIG. 15 show one of its examples.

FIG. 14(A) shows a personal computer which includes a main body 2001, an image input portion 2002, a display portion 2003, a keyboard 2004 and the like. The invention can be applied to a plastic substrate thereby it can be lightened.

FIG. 14(B) shows a video camera which includes a main body 2101, a display portion 2102, a sound input portion 2103, operating switches 2104, a battery 2105, an image receiving portion 2106 and the like. The invention can be applied a plastic substrate thereby it can be lightened.

FIG. 14(C) shows a game appliance which includes a main body 2201 and a display portion 2205 and the like. The invention can be applied to a plastic substrate thereby it can be lightened.

FIG. 14(D) shows a player using a recording medium on which a program is recorded (hereinafter referred to as a recording medium), and the player includes a main body 2401, a display portion 2402, speaker portions 2403, a recording medium 2404, operating switches 2405 and the like. This player uses a DVD (Digital Versatile Disc), a CD and the like as the recording medium, and enables a user to enjoy music, movies, games and the Internet.

FIG. 14(E) shows a digital camera which includes a body 2501, a display portion 2502, an eyepiece portion 2503, operating switches 2504, an image receiving portion (not shown) and the like. The invention can be applied to a plastic substrate thereby it can be lightened.

FIG. 15(A) shows a mobile telephone which includes such as a main body 2901, a sound output portion 2902, a sound input portion 2903, a display portion 2904, operating switches 2905, an antenna 2906, an image input portion 2907 (such as CCD and an image sensor).

FIG. 15(B) shows a mobile book (electronic book) which includes a main body 3001, display portions 3002 and 3003, a storage medium 3004, operating switches 3005, an antenna 3006 and the like. The invention can be applied to a plastic substrate thereby it can be lightened.

FIG. 15(C) shows a display which includes a main body 3101, a support base 3102, a display portion 3103 and the like. The invention can be applied to a plastic substrate thereby it can be lightened.

In addition, the display shown in FIG. 15(C) has a display in small, medium or large size, for example a size of 5 to 20 inches. Further, to manufacture the display portion with such sizes, it is preferable to mass-produce by taking multiple pattern using a substrate with one meter on a side.

As described above, the applicable range of the present invention is so wide that the invention can be applied to electronics devices of various fields. Note that the electronics devices of this embodiment can be achieved by utilizing any combination of constitutions in Embodiment Modes 1 through 5 and Embodiments 1 through 7.

Embodiment 9

The electronics devices represented in Embodiment 8 includes a panel in which a light-emitting element is sealed, loaded a module provided with a controller and an IC including such as a power source circuit and the like. The module and the panel are both corresponding to one mode of the light-emitting device. In the present invention, a specific configuration of the module will be described.

Figure 16:
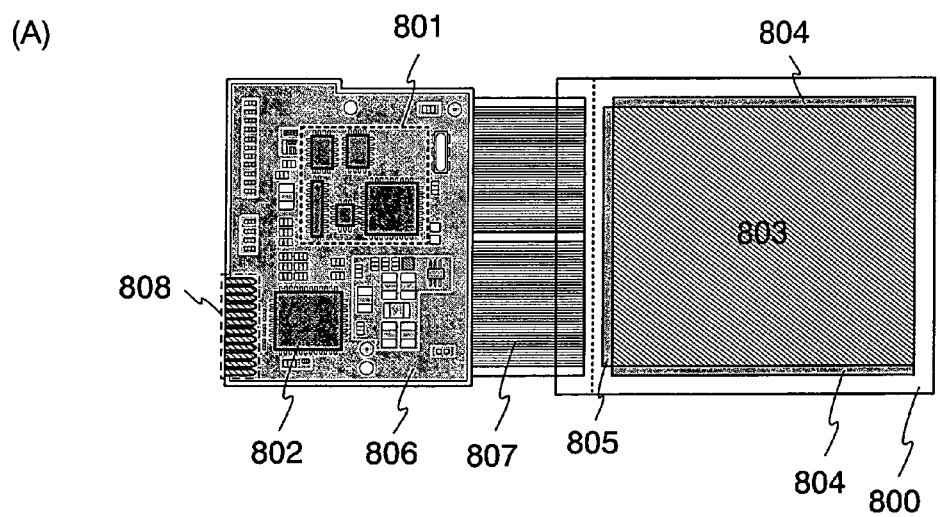
FIG. 16 is a figure showing modules. (Embodiment 9)
Figure 16:
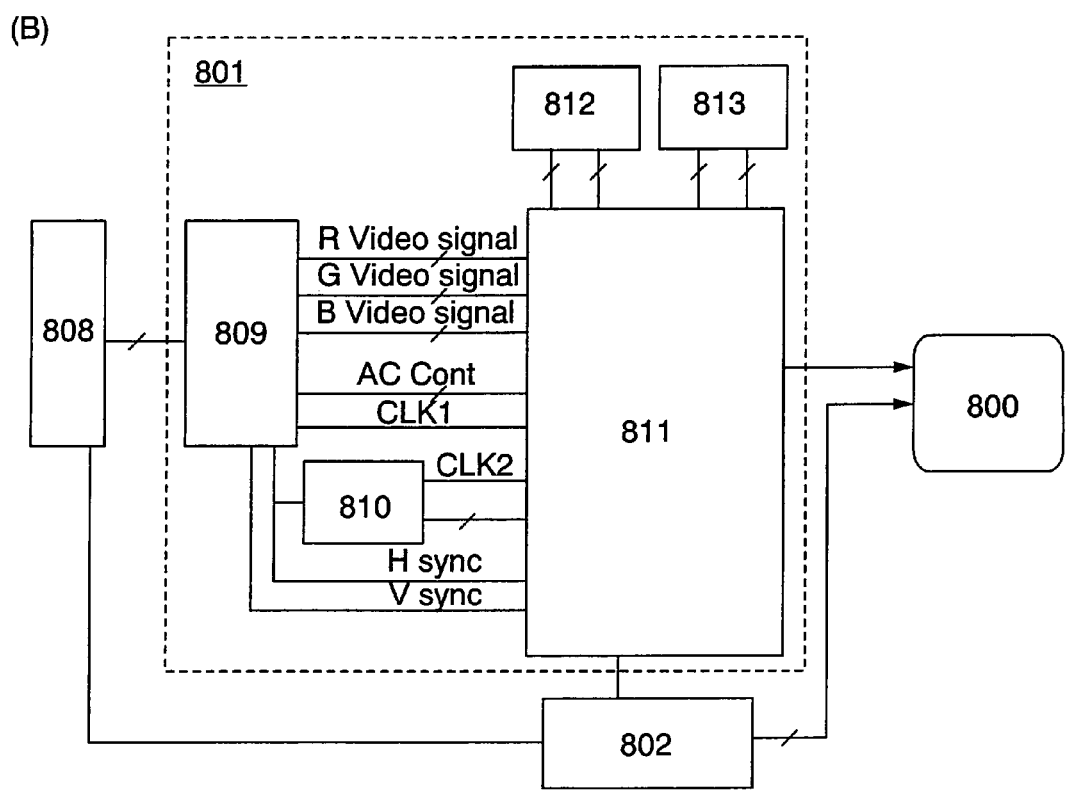

FIG. 16(A) shows an appearance of a module in which a panel 800 is provided with a controller 801 and a power source circuit 802. There are provided in the panel 800 with a pixel portion 803 in which a light-emitting element is provided in each pixel, a scan line driving circuit 804 for selecting a pixel in the pixel portion 803, and a signal line driving circuit 805 for supplying a video signal to the selected pixel.

The controller 801 and the power source circuit 802 are provided in a printed substrate 806. Various signals and power source voltage, which are output from the controller 801 or the power source circuit 802, respectively, are supplied through FPC 807 to the pixel portion 803, the gate line driving circuit 804, and the signal line driving circuit 805 on the panel 800.

Through an interface (I/F) 808 in which a plurality of input terminals are arranged, power source voltage and various signals to the printed circuit 806 is supplied.

Although the printed substrate 806 is attached to the panel 800 with FPC in the present embodiment, the present invention is not limited to this configuration. The controller 801 and the power source circuit 802 may be provided directly in the panel 800 with COG (Chip on Glass) manner.

In the present embodiment, an example in which various circuits are constructed by loading various IC chips on the print substrate 806 is shown. However, it is possible to incorporate a large-scale integrated circuit (LSI) with a use of polysilicon on a plastic substrate in the forming method of an element shown in the Embodiment 7, thereby a plastic substrate provided with LSI can be used instead of an IC chip.

Further, as for the printed circuit 806, there is a case that a capacity formed between leading wirings and a resistance of a wiring itself cause a noise to a power source voltage or a signal, or make a rise of a signal dull. Therefore, it may prevent the noise to the power source voltage or a signal and the dull rise of the signal by providing various kinds of elements such as a capacitor and a buffer in the printed substrate 806.

FIG. 16(B) is a block diagram showing a configuration of the printed substrate 806. Various kinds of signals and power source voltage supplied to the interface 808 are supplied to the controller 801 and the power source circuit 802.

The controller 801 has an A/D converter 809, a phase locked loop (PLL) 810, control signal generating portion 811, and SRAM (Static Random Access Memory) 812 and 813. Although the SRAM is used in the present embodiment, instead of the SRAM, SDRAM can be used and DRAM (Dynamic Random Access Memory) can also be used if it is possible to write in and read out data at high speed.

Video signals supplied via the interface 808 are subjected to a parallel-serial conversion in the A/D converter 809 to be input into the control signal generating portion 811 as video signals corresponding to respective colors of R, G, and B. Further, based on various kinds of signals supplied via the interface 808, Hsync signal, Vsync signal, clock signal CLK, and a volts alternating current (AC cont) are generated in the A/D converter 809 to be input into the control signal generating portion 811.

The phase locked loop 810 has a function of synchronizing frequencies of the various kinds of signals supplied via the interface 808 and an operation frequency of the control signal generating portion 811. The operation frequency of the control signal generating portion 811 is not always the same as the frequencies of the various kinds of signals supplied via the interface 808, however, the operation frequency of the control signal generating portion 811 is controlled in the phase locked loop 810 in order to synchronize each other.

The video signals inputted to the control signal generating portion 811 are once written in SRAM 812 and 813 and stored. In the control signal generating portion 811, video signals stored in the SRAM 812 which is corresponding to all pixels are read out per one bit, and input to a signal line driving circuit 805 of the panel 800.

Further, in the control signal generating portion 811, information for each bit regarding a period during which the light-emitting element emits light, is input to a scanning line driving circuit 804 of the panel 800.

In addition, the power source circuit 802 supplies a predetermined power source voltage to the signal line driving circuit 805, the scanning line driving circuit 804 and the pixel portion 803 of the panel 800.

Next, a detailed configuration of the power source circuit 802 will be described with FIG. 17. The power source circuit 802 of the present embodiment is composed of a switching regulator 854 that employs four switching regulator controls 860 and a series regulator 855.

In general, a switching regulator is smaller and lighter than a series regulator, and capable of not only step-down but also step-up, and inversion of positive and negative. On the other hand, the series regulator is used only for step-down while an output voltage has a high precision, compared to the switching regulator, and there are almost no possibility for occurrence of a ripple or a noise. The power source circuit 802 in the present embodiment uses the both combined.

Figure 17:
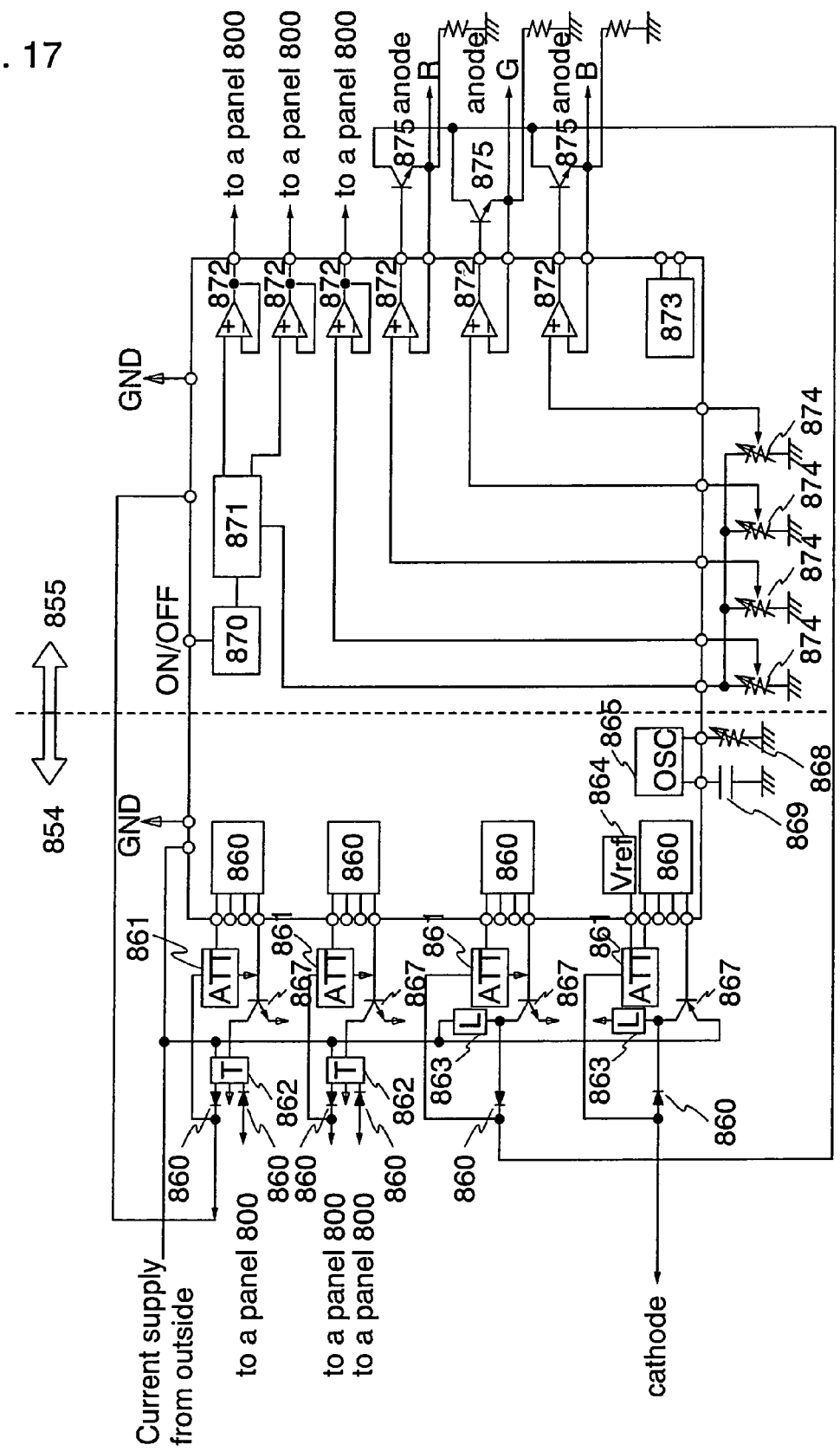
FIG. 17 is a figure showing a block diagram. (Embodiment 9)

The switching regulator 854 shown in FIG. 17 has the switching regulator controls (SWR) 860, attenuators (ATT) 861, transformers (T) 862, inductors (L) 863, a reference power source (Vref) 864, an oscillation circuit (OSC) 865, diodes 866, bipolar transistors 867, a variable resistor 868, and a capacity 869.

When a voltage of such an outside Li ion buttery (3.6V) is converted in the switching regulator 854, a power source voltage given to a cathode and a power source voltage supplied to a switching regulator 854 are generated.

Further, a series regulator 855 has a band gap circuit (BG) 870, an amplifier 871, operation amplifiers 872, a current source 873, variable resistors 874 and bipolar transistors 875, and a power source voltage generated in a switching regulator 854 is supplied thereto.

In a series regulator 855, based on a predetermined electronic voltage generated in the band gap circuit 870, a power source voltage of a direct current is generated, which is to be given a wiring (referred to also as a wiring for the current supply) for supplying a current to an anode of a light-emitting element corresponding to each color using a power source voltage generated in switching regulator 854.

Still, a current source 873 is used in the case of the driving method that the electric current of video signal is written in the pixel. In this case, the electric current generated in current source 873 is provided for a signal line driving circuit 805 of a panel 800. However, a current source 873 is not indispensable in the case the driving method that voltage of a video signal is written in the pixel.

Note that the electronics devices of this embodiment can be achieved by utilizing any combination of constitutions in Embodiment Modes 1 through 5 and Embodiments 1 through 8.

What is claimed is:

1. A display device comprising:
   a magnetic sheet;
   an adhesive material adjacent to the magnetic sheet;
   an insulating film adjacent to the adhesive material; and
   a thin film transistor adjacent to the insulating film,
   wherein the magnetic sheet comprises a material selected from the group consisting of barium ferrite, strontium ferrite, and rare earth magnet.

2. The display device according to claim 1, wherein the magnetic sheet is formed by mixing soft magnetic powder and synthetic resin and by magnetizing said mixture.

3. An electronic device selected from group consisting of an authentication card, a video camera, a digital camera, a goggle type display, a car navigation system, a personal computer, and a mobile information terminal comprising the display device according to claim 1.

4. A display device comprising:
   a magnetic sheet;
   an adhesive material adjacent to the magnetic sheet;
   an insulating film adjacent to the adhesive material; and
   a light emitting element adjacent to the insulating film,
   wherein the light emitting element comprises a first electrode, a second electrode, and a light emitting layer, and
   wherein the magnetic sheet comprises a material selected from the group consisting of barium ferrite, strontium ferrite, and rare earth magnet.

5. The display device according to claim 4, wherein the magnetic sheet is formed by mixing soft magnetic powder and synthetic resin and by magnetizing said mixture.

6. An electronic device selected from group consisting of an authentication card, a video camera, a digital camera, a goggle type display, a car navigation system, a personal computer, and a mobile information terminal comprising the display device according to claim 4.

7. A display device comprising:
   a magnetic sheet;
   an adhesive material over the magnetic sheet;
   an insulating film over the adhesive material;
   a thin film transistor over the insulating film; and
   a light emitting element over the insulating film,
   wherein the light emitting element comprises a first electrode, a second electrode, and a light emitting layer,
   wherein the first electrode is electrically connected to the thin film transistor, and
   wherein the magnetic sheet comprises a material selected from the group consisting of barium ferrite, strontium ferrite, and rare earth magnet.

8. The display device according to claim 7, wherein the magnetic sheet is formed by mixing soft magnetic powder and synthetic resin and by magnetizing said mixture.

9. An electronic device selected from group consisting of an authentication card, a video camera, a digital camera, a goggle type display, a car navigation system, a personal computer, and a mobile information terminal comprising the display device according to claim 7.

10. A display device comprising:
    a substrate;
    a magnetic sheet over the substrate;
    an insulating film between the substrate and the magnetic sheet;
    a thin film transistor between the magnetic sheet and the insulating film;
    a light emitting element between the magnetic sheet and the insulating film; and
    an adhesive material between the magnetic sheet and the light emitting element,
    wherein the light emitting element comprises a first electrode, a second electrode, and a light emitting layer,
    wherein the first electrode is electrically connected to the thin film transistor, and
    wherein the magnetic sheet comprises a material selected from the group consisting of barium ferrite, strontium ferrite, and rare earth magnet.

11. The display device according to claim 10, wherein the magnetic sheet is formed by mixing soft magnetic powder and synthetic resin and by magnetizing said mixture.

12. An electronic device selected from group consisting of an authentication card, a video camera, a digital camera, a goggle type display, a car navigation system, a personal computer, and a mobile information terminal comprising the display device according to claim 10.

13. A display device comprising:
    a magnetic sheet;
    an adhesive material adjacent to the magnetic sheet;
    an insulating film adjacent to the adhesive material;
    a thin film transistor adjacent to the insulating film; and
    a pixel electrode over the thin film transistor, the pixel electrode being electrically connected to the thin film transistor,
    wherein the magnetic sheet comprises a material selected from the group consisting of barium ferrite, strontium ferrite, and rare earth magnet.

14. The display device according to claim 13, wherein the magnetic sheet is formed by mixing soft magnetic powder and synthetic resin and by magnetizing said mixture.

15. An electronic device selected from group consisting of an authentication card, a video camera, a digital camera, a goggle type display, a car navigation system, a personal computer, and a mobile information terminal comprising the display device according to claim 13.

* * * * *